US012484428B2

(12) United States Patent
Kim

(10) Patent No.: US 12,484,428 B2
(45) Date of Patent: Nov. 25, 2025

(54) DISPLAY DEVICE

(71) Applicant: LG Display Co., Ltd., Seoul (KR)

(72) Inventor: Wondoo Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 492 days.

(21) Appl. No.: 17/977,795

(22) Filed: Oct. 31, 2022

(65) Prior Publication Data

US 2023/0217797 A1 Jul. 6, 2023

(30) Foreign Application Priority Data

Dec. 31, 2021 (KR) .................. 10-2021-0194525

(51) Int. Cl.
| | | |
|---|---|---|
| *H10K 59/88* | (2023.01) | |
| *H10D 86/40* | (2025.01) | |
| *H10D 86/60* | (2025.01) | |
| *H10K 59/131* | (2023.01) | |
| *H10K 59/35* | (2023.01) | |
| *H10K 71/00* | (2023.01) | |

(52) U.S. Cl.
CPC .......... *H10K 59/88* (2023.02); *H10D 86/441* (2025.01); *H10D 86/60* (2025.01); *H10K 59/131* (2023.02); *H10K 59/351* (2023.02); *H10K 71/861* (2023.02)

(58) Field of Classification Search
CPC .. H10K 59/131; H10K 59/351; H10K 71/861; H10D 86/441; H10D 86/60
See application file for complete search history.

(56) References Cited

U.S. PATENT DOCUMENTS

| | | | | |
|---|---|---|---|---|
| 2008/0024691 | A1* | 1/2008 | Okabe ................ | G02F 1/13624 |
| | | | | 349/54 |
| 2018/0088365 | A1* | 3/2018 | Zhao ..................... | H10D 89/015 |
| 2018/0151658 | A1 | 5/2018 | Jeong et al. | |
| 2018/0294289 | A1* | 10/2018 | Wang .................... | H10D 86/60 |
| 2019/0371235 | A1* | 12/2019 | Lee ....................... | G09G 3/3225 |
| 2021/0083221 | A1 | 3/2021 | Lee | |
| 2021/0183963 | A1* | 6/2021 | Jang ................. | H10K 59/80515 |
| 2024/0215351 | A1* | 6/2024 | Shin ..................... | H10K 59/131 |

FOREIGN PATENT DOCUMENTS

| | | | | |
|---|---|---|---|---|
| KR | 20160025327 A | * | 3/2016 | ............. H10K 50/81 |
| KR | 20180062516 A | | 6/2018 | |
| KR | 20210086411 A | | 7/2021 | |
| WO | 2020213157 A1 | | 10/2020 | |

* cited by examiner

*Primary Examiner* — Jeff W Natalini
*Assistant Examiner* — Brandon C Fox
(74) *Attorney, Agent, or Firm* — Seed Intellectual Property Law Group LLP

(57) ABSTRACT

A display device includes a substrate having a plurality of sub-pixels provided thereon, each of the plurality of pixels including an emission area and a non-emission area, at least one gate line disposed in the non-emission area and extended in one direction, at least one signal line disposed in the non-emission area and crossing the at least one gate line, at least one repair bridge line connected to the at least one signal line. The plurality of sub-pixels includes a red sub-pixel, a white sub-pixel, a green sub-pixel, and a blue sub-pixel, a structure of the green sub-pixel and the blue sub-pixel is inverted with respect to a structure of the red sub-pixel and the white sub-pixel, the at least one repair bridge line is formed in a layer different from a layer of the at least one gate line.

18 Claims, 9 Drawing Sheets

DISPLAY DEVICE

CROSS-REFERENCE TO RELATED APPLICATIONS

This application claims priority to Korean Patent Application No. 10-2021-0194525 filed in the Korean Intellectual Property Office on Dec. 31, 2021, the disclosure of which is incorporated herein by reference in its entirety as if fully set forth herein.

BACKGROUND

Technical Field

The present disclosure relates to a display device, and more particularly to a display device that can conduct repair stably while achieving a high aperture ratio.

Description of the Related Art

As the era of information technology has begun, the field of display devices that represent electrical information signals graphically has been rapidly grown up. In accordance with this, various display devices which are thinner, lighter and consume less power have been developed.

Examples of display devices may include a liquid-crystal display device (LCD), a field emission display device (FED), an electro-wetting display device (EWD), and an organic light-emitting display device (OLED), etc.

Among these, an OLED device is capable of producing light in its own and thus does not require any additional light source, unlike a liquid-crystal display (LCD) device. Therefore, an OLED device can be made lighter and thinner than an LCD device. In addition, an organic light-emitting display device has advantages in that it is driven with low voltage to consume less power, and in that it represents vivid colors and has short response time, wide viewing angle and good contrast ratio (CR). For these reasons, a OLED device finds more and more applications.

An organic light-emitting display device is implemented by disposing an emissive layer using an organic material between two electrodes, i.e., as an anode and a cathode. Holes in the anode are injected into the emissive layer, and electrons in the cathode are injected into the emissive layer, such that the electrons and the holes are recombined to form excitons in the emissive layer, and light is emitted therefrom.

BRIEF SUMMARY

The present disclosure provides a display device in which a repair area is located where the aperture ratio can be increased by changing the structure of a reference branch line.

The present disclosure provides a display device in which a gate signal can be transmitted via a bypass line during a repair process without compromising the aperture ratio.

Technical benefits of the present disclosure are not limited to the above-mentioned technical benefits, and other technical benefits, which are not mentioned above, can be clearly understood by those skilled in the art from the following descriptions.

According to an aspect of the present disclosure, there is provided a display device including: a substrate having a plurality of sub-pixels provided thereon, each of the plurality of pixels including an emission area and a non-emission area; at least one signal line disposed in the non-emission area and crossing at least one gate line; and at least one repair bridge line connected to the at least one signal line. The plurality of sub-pixels includes a red sub-pixel, a white sub-pixel, a green sub-pixel, and a blue sub-pixel. A structure of the green sub-pixel and the blue sub-pixel is inverted with respect to a structure of the red sub-pixel and the white sub-pixel. The at least one repair bridge line is formed in a layer different from a layer of the at least one gate line. The at least one repair bridge line is connected to the at least one high-level supply voltage line to traverse the emission areas of the plurality of sub-pixels.

According to another aspect of the present disclosure, there is provided a display device including: a substrate having a plurality of sub-pixels provided thereon, each of the plurality of pixels including an emission area and a non-emission area; at least one signal line disposed in the non-emission area and crossing at least one gate line; and at least one repair bridge line connected to the at least one signal line. The plurality of sub-pixels includes a red sub-pixel, a white sub-pixel, a green sub-pixel, and a blue sub-pixel. A structure of the green sub-pixel and the blue sub-pixel is inverted with respect to a structure of the red sub-pixel and the white sub-pixel. The at least one repair bridge line is formed in a layer different from a layer of the at least one gate line. The at least one repair bridge line branches off from the at least one reference line.

Other detailed matters of the example embodiments are included in the detailed description and the drawings.

According to an example embodiment of the present disclosure, a bypass line for transmitting a gate signal in a repair process on a gate line has transparency, so that the aperture ratio can be improved.

According to an example embodiment of the present disclosure, a bypass line for transmitting a gate signal in a repair process on a gate line branches off from an existing signal line, so that the aperture ratio can be improved.

According to an example embodiment of the present disclosure, the open area can be increased by changing the shape of a reference branch line and relocating a repair area for a reference line.

According to an example embodiment of the present disclosure, a repair process on a gate line can be carried out stably while achieving a high aperture ratio.

According to an example embodiment of the present disclosure, the open area can be increased, so that the bending of the data line can be reduced, and thus the aperture ratio can be increased.

The effects according to the present disclosure are not limited to the contents exemplified above, and more various effects are included in the present specification.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
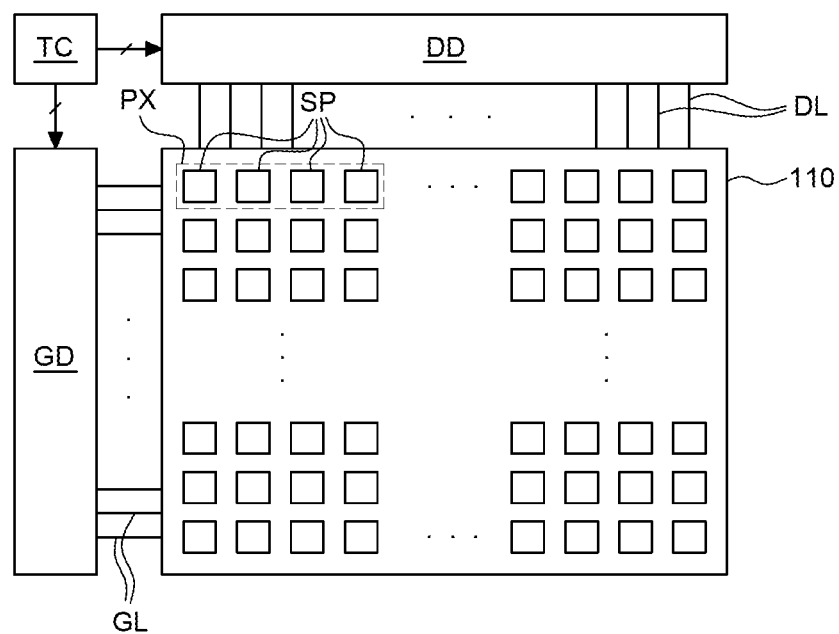
FIG. 1 is a block diagram of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Herein, transistors used in a display device may be implemented as one or more of n-channel transistors (NMOS) and p-channel transistors (PMOS). The transistors may be implemented as an oxide semiconductor transistor having an oxide semiconductor as an active layer or an LTPS transistor having a low-temperature poly-silicon (LTPS) as an active layer. Each of the transistors may include at least a gate electrode, a source electrode and a drain electrode. The transistors may be implemented as thin-film transistors (TFT) on the display panel. In the transistors, the carriers flow from the source electrode to the drain electrode. For an n-channel transistor (NMOS) where electrons are the carriers, the voltage at the source electrode is lower than the voltage at the drain electrode to allow the electrons to flow from the source electrode to the drain electrode. In an n-channel transistor NMOS, electric current flows from the drain electrode to the source electrode, and the source electrode may be an output terminal. For a p-channel transistor (PMOS) where holes are the carriers, the voltage at the source electrode is higher than the voltage at the drain electrode to allow the holes to flow from the source electrode to the drain electrode. In a p-channel transistor PMOS, as holes flow from the source electrode to the drain electrode, electric current flows from the source to the drain, and the drain electrode may be an output terminal. As such, it is to be noted that the source and drain of a transistor are not fixed but may be switched depending on the applied voltage. Herein, it is assumed that transistors are n-channel transistors (NMOS), but the present disclosure is not limited thereto. P-channel transistors may be employed and the circuit configuration may be altered accordingly.

For transistors used as switching elements, a gate signal swings between a gate-on voltage and a gate-off voltage. The gate-on voltage is set to a voltage higher than the threshold voltage Vth of a transistor, while the gate-off voltage is set to a voltage lower than the threshold voltage Vth of the transistor. The transistor is turned on in response to the gate-on voltage and is turned off in response to the gate-off voltage. For a NMOS transistor, the gate-on voltage may be a gate-high voltage (VGH), and the gate-off voltage may be a gate-low voltage (VGL). For a PMOS transistor, the gate-on voltage may be a gate-low voltage (VGL), and the gate-off voltage may be a gate-high voltage (VGH).

Hereinafter, example embodiments of the present disclosure will be described in detail with reference to the accompanying drawings.

FIG. 1 is a block diagram of a display device according to an example embodiment of the present disclosure. Referring to FIG. 1, a display device 100 includes a display panel 110, a gate driver GD, a data driver DD, and a timing controller TC.

The display panel 110 is a panel for displaying images. The display panel 110 may include a variety of circuits, lines, and light-emitting elements disposed on a substrate. The display panel 110 may include a plurality of pixels, each of which correspond to a plurality of data lines DL and a plurality of gate lines GL intersecting one another and is connected to the data lines DL and the gate lines GL. The display panel 110 may include a display area having the plurality of pixels PX and a non-display area where various signal lines, pads, etc., are formed. The display panel 110 may be implemented as a display panel used in various display devices such as a liquid-crystal display device, an organic light-emitting display device and an electrophoretic display device. In the following description, the display panel 110 is described as a panel used in an organic light-emitting display device. It is, however, to be understood that the present disclosure is not limited thereto.

The timing controller TC receives timing signals such as a vertical synchronization signal, a horizontal synchronization signal, a data enable signal and a dot clock via a receiving circuit such as LVDS and TMDS interfaces connected to a host system. The timing controller TC generates timing control signals for controlling the data driver DD and the gate driver GD based on the received timing signals.

The data driver DD supplies data voltage to a plurality of sub-pixels SP. The data driver DD may include a plurality of source drive integrated circuits (ICs). The plurality of source drive ICs may receive digital video data and a source timing control signal from the timing controller TC. The source drive ICs may convert the digital video data items into a gamma voltage in response to a source timing control signal to generate a data voltage DATA, and may apply the data voltage via the data lines DL of the display panel 110. The source drive ICs may be connected to the data lines DL of the display panel 110 by a chip-on-glass (COG) process or a tape automated bonding (TAB) process. In addition, the source drive ICs may be formed on the display panel 110 or may be formed on a separate PCB and connected to the display panel 110.

The gate driver GD supplies gate signals to the sub-pixels SP. The gate driver GD may include a level shifter and a shift register. The level shifter may shift the level of a clock signal input at a transistor-transistor-logic (TTL) level from the timing controller TC and then may supply it to the shift register. The shift register may be formed in, but is not limited to, the non-display area of the display panel 110 by using a GIP technique. The shift register may include a plurality of stages for shifting gate signals to output them in response to the clock signal and the driving signal. The plurality of stages included in the shift register may sequentially output gate signals through the plurality of output terminals.

The display panel 110 may include a plurality of sub-pixels SP. The plurality of sub-pixels SP may emit different colors. For example, each of the plurality of sub-pixels SP may include, but is not limited to, a red sub-pixel, a green sub-pixel, a blue sub-pixel and a white sub-pixel. Such sub-pixels SP may form pixels PX. Specifically, a red sub-pixel, a green sub-pixel, a blue sub-pixel and a white sub-pixel may form one pixel PX, and the display panel 110 may include a plurality of pixels PX.

Hereinafter, a driver circuit for driving a single sub-pixel SP will be described in detail with reference to FIG. 2.

Figure 2:
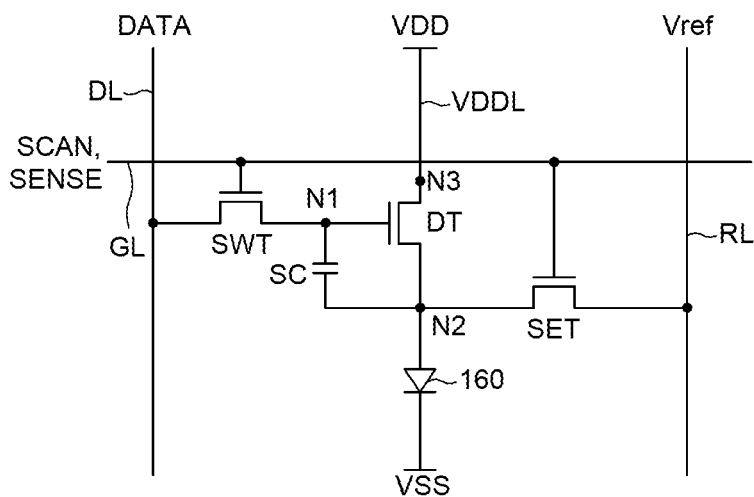
FIG. 2 is a circuit diagram of a sub-pixel of a display device according to an example embodiment of the present disclosure.

FIG. 2 is a circuit diagram of a sub-pixel of a display device according to an example embodiment of the present disclosure. FIG. 2 shows a circuit diagram of one of a plurality of sub-pixels SP of the display device 100.

Referring to FIG. 2, the sub-pixel SP may include a switching transistor SWT, a sensing transistor SET, a driving transistor DT, a storage capacitor SC, and a light-emitting element 160.

The light-emitting element 160 may include an anode, an organic layer, and a cathode. The organic layer may further include a variety of organic layers such as a hole injection layer, a hole transport layer, an organic emissive layer, an electron transport layer, and an electron injection layer. The anode of the light-emitting element 160 may be connected to the output terminal of the driving transistor DT, and a low-level voltage VSS may be applied to the cathode. Although an organic light-emitting element is employed as the light-emitting element 160 in the example shown in FIG. 2, the present disclosure is not limited thereto. An inorganic light-emitting diode, i.e., an LED may also be used as the light-emitting element 160.

Referring to FIG. 2, the switching transistor SWT is a transistor for transferring the data voltage DATA to a first node N1 corresponding to the gate electrode of the driving transistor DT. The switching transistor SWT may include a drain electrode connected to the data line DL, a gate electrode connected to the gate line GL, and a source electrode connected to the gate electrode of the driving transistor DT. The switching transistor SWT may be turned on by a scan signal SCAN applied from the gate line GL to transfer the data voltage DATA supplied from the data line DL to the first node N1 that is the gate electrode of the driving transistor DT.

Referring to FIG. 2, the driving transistor DT is a transistor for driving the light-emitting element 160 by supplying a driving current to the light-emitting element 160. The driving transistor DT may include a gate electrode associated with the first node N1, a source electrode associated with the second node N2 and working as the output terminal, and a drain electrode associated with the third node N3 and working as the input terminal. The gate electrode of the driving transistor DT may be connected to the switching transistor SWT, the drain electrode may receive a high-level voltage VDD through a high-level voltage line VDDL, and the source electrode may be connected to the anode of the light-emitting element 160.

Referring to FIG. 2, the storage capacitor SC is a capacitor for holding a voltage equal to the data voltage DATA for one frame. One electrode of the storage capacitor SC may be connected to the first node N1, and the other electrode of the storage capacitor SC may be connected to the second node N2.

Incidentally, as the driving time of each sub-pixel SP in the display device 100 increases, the circuit elements such as the driving transistor DT may be degraded. As a result, the characteristic values of the circuit elements such as the driving transistor DT may be changed. The characteristic values of the circuit elements may include the threshold voltage Vth of the driving transistor DT, the mobility a of the driving transistor DT, etc. Such change in the characteristic values of the circuit elements may cause a change in luminance of the respective sub-pixel SP. Therefore, a change in the characteristic values of the circuit elements may be regarded as a change in luminance of the sub-pixel SP.

In addition, the degree of the change in characteristic values of the circuit elements of each of the sub-pixels SP may be different depending on the degree of degradation of the circuit elements. Such difference in the degree of change in the characteristic values between the circuit elements may cause deviations in luminance between the sub-pixels SP. Therefore, deviations in the characteristic values of the circuit elements may be regarded as deviations in luminance of the sub-pixel SP. A change in the characteristic values of the circuit elements, that is, a change in the luminance of the sub-pixel SP and deviations in the characteristic values between the circuit elements, that is, deviations in the luminance between the sub-pixels SP may lower the accuracy of the luminance represented by the sub-pixels SP or may generate defects on the images.

In view of the above, the sub-pixel SP of the display device 100 according to an example embodiment of the present disclosure can provide a feature of sensing the characteristic values of the sub-pixel SP, and a feature of compensating for the characteristic values of the sub-pixel SP based on the results of the sensing.

To this end, as shown in FIG. 2, the sub-pixel SP may further include a sensing transistor SET for effectively controlling the voltage status at the source electrode of the driving transistor DT, in addition to the switching transistor SWT, the driving transistor DT, the storage capacitor SC and the light-emitting element 160.

Referring to FIG. 2, the sensing transistor SET is connected between the source electrode of the driving transistor DT and a reference line RL for supplying a reference voltage Vref, and its gate electrode is connected to the gate line GL. Accordingly, the sensing transistor SET may be turned on by a sensing signal SENSE applied through the gate line GL to apply the reference voltage Vref supplied through the reference line RL to the source electrode of the driving transistor DT. In addition, the sensing transistor SET may be utilized as one of voltage sensing paths for the source electrode of the driving transistor DT.

Referring to FIG. 2, the switching transistor SWT and the sensing transistor SET of the sub-pixel SP may share the single gate line GL. That is to say, the switching transistor SWT and the sensing transistor SET may receive the same gate signal applied from the same gate line GL. Although the voltage applied to the gate electrode of the switching transistor SWT is referred to as a scan signal SCAN while the voltage applied to the gate electrode of the sensing transistor SET is referred to as a sensing signal SENSE for convenience of illustration, it is to be understood that the scan signal SCAN and the sensing signal SENSE applied to one sub-pixel SP are the same signal transferred from the same gate line GL. Accordingly, in FIG. 3, the scan signal SCAN and the sensing signal SENSE are referred to as gate signals GATE1, GATE2, GATE3 and GATE4.

It should be understood, however, that the present disclosure is not limited thereto. Only the switching transistor SWT may be connected to the gate line GL, and the sensing transistor SET may be connected to a separate sensing line. Accordingly, the scan signal SCAN may be applied to the switching transistor SWT through the gate line GL, and the sensing signal SENSE may be applied to the sensing transistor SET through the sensing line.

Accordingly, the reference voltage Vref is applied to the source electrode of the driving transistor DT through the sensing transistor SET. In addition, the threshold voltage Vth of the driving transistor DT or a voltage for sensing the mobility a of the driving transistor DT is detected through the reference line RL. Then, the data driver DD may compensate for the data voltage DATA according to the detected amount of change in the threshold voltage Vth of the driving transistor DT or the mobility a of the driving transistor DT.

Figure 3:
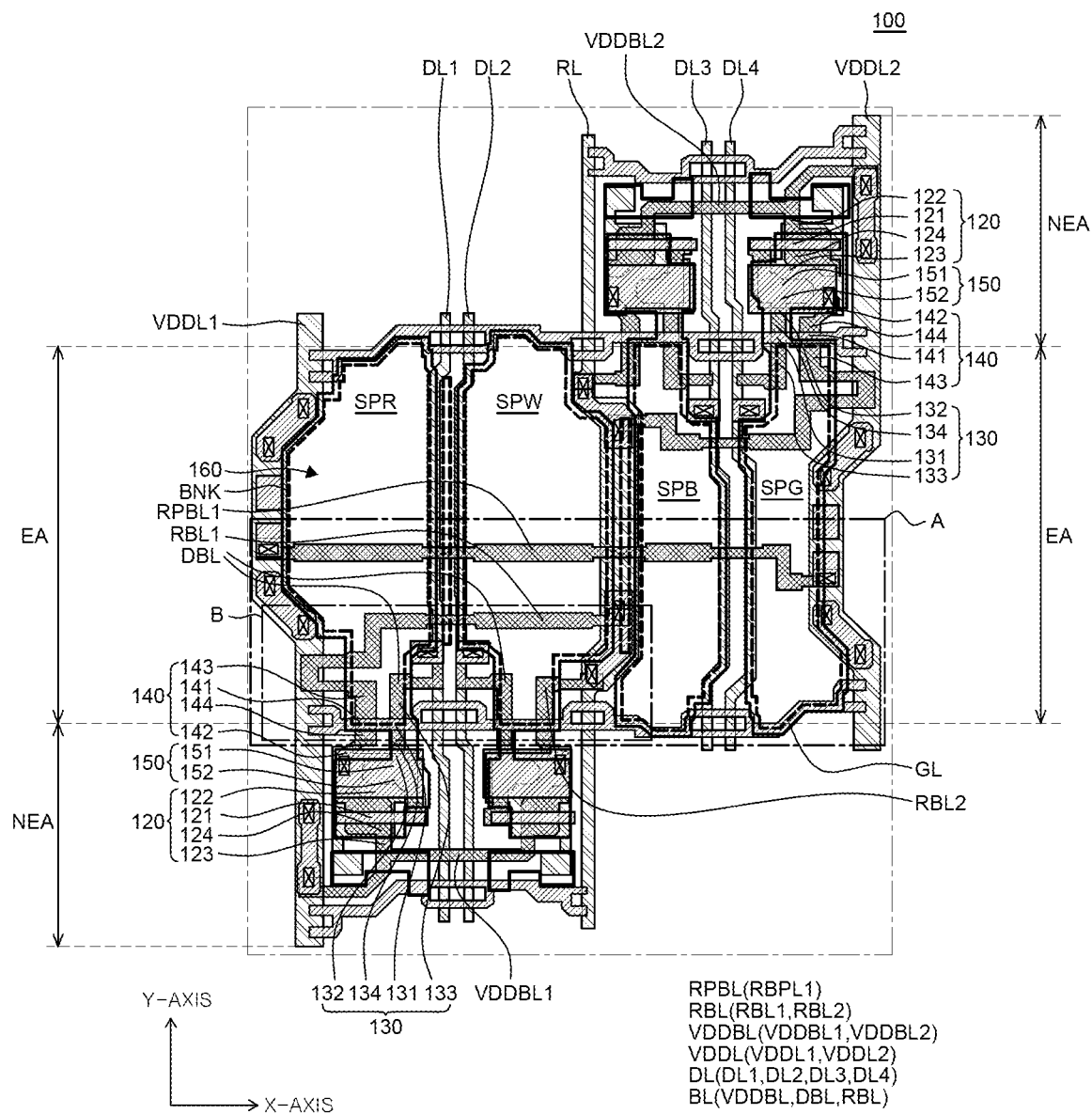
FIG. 3 is an enlarged plan view of a display device according to an example embodiment of the present disclosure.
Figure 4:
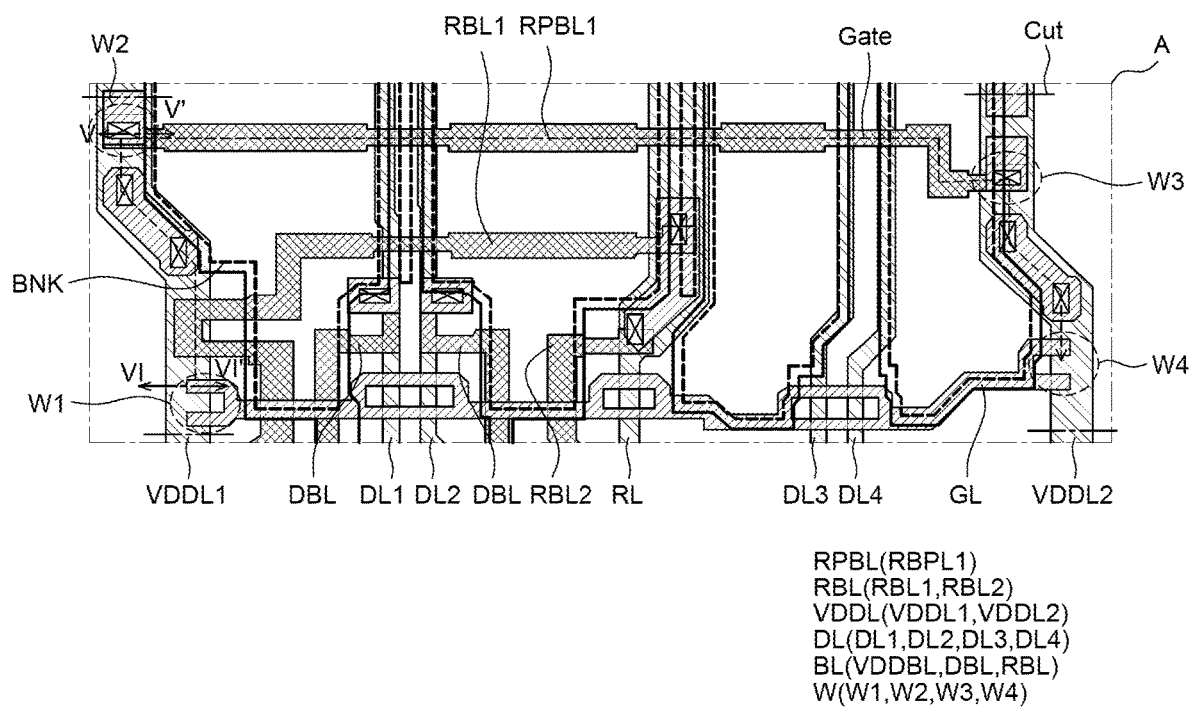
FIG. 4 is an enlarged view of area A of FIG. 3.
Figure 5A:
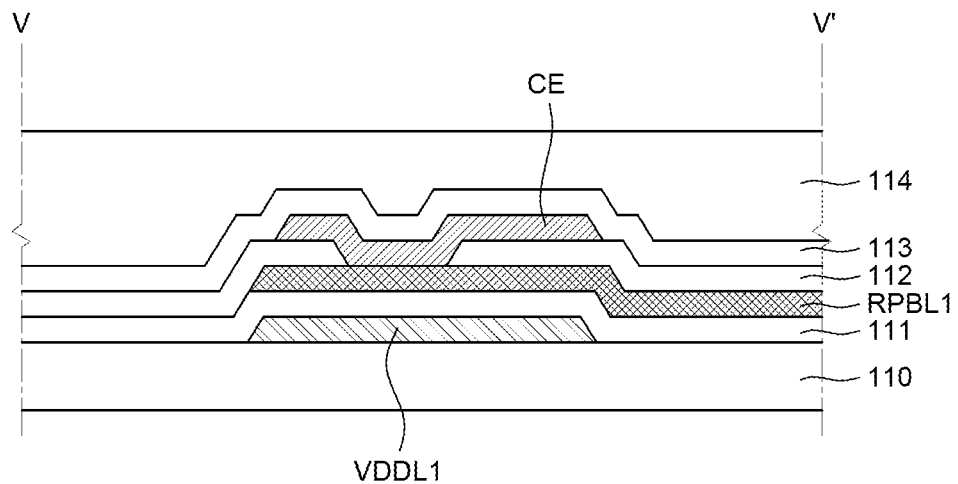
FIGS. 5A and 5B are cross-sectional views taken along line V-V' of FIG. 4.
Figure 5B:
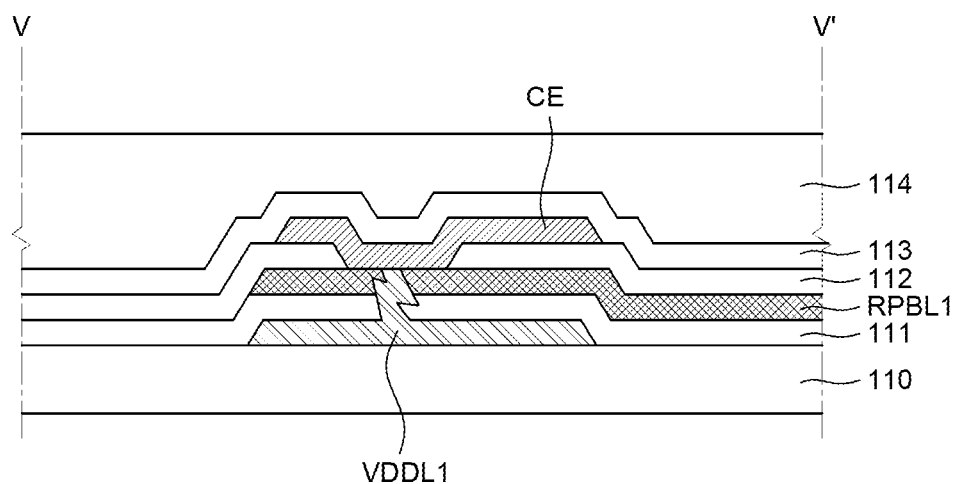
Figure 6A:
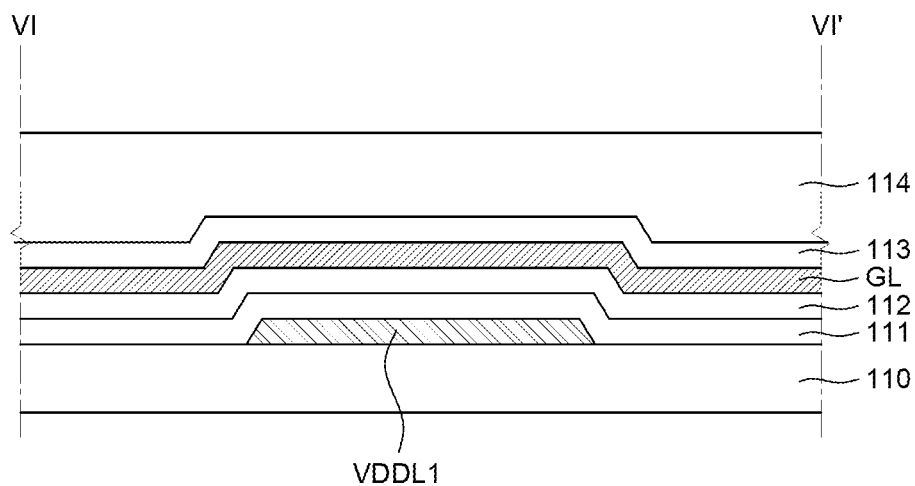
FIGS. 6A and 6B are cross-sectional views taken along line VI-VI' of FIG. 4.
Figure 6B:
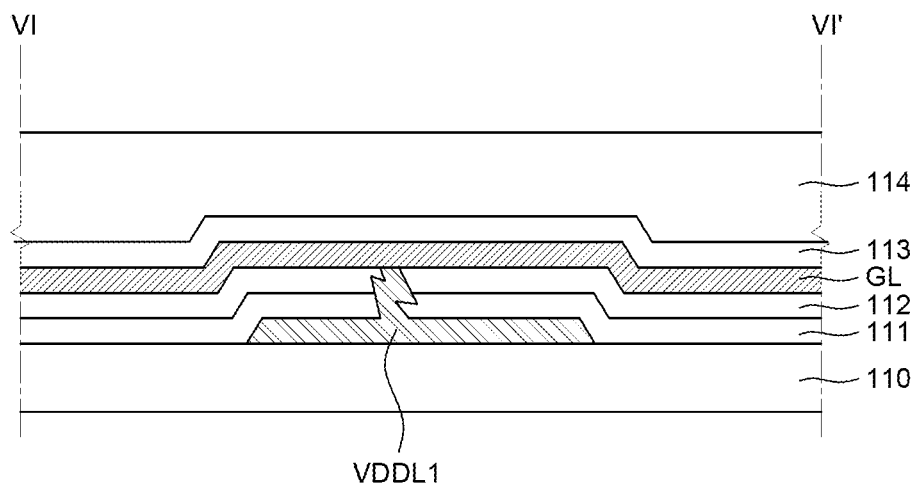

FIG. 3 is an enlarged plan view of a display device according to an example embodiment of the present disclosure. FIG. 4 is an enlarged view of area A of FIG. 3. FIGS. 5A and 5B are cross-sectional views taken along line V-V' of FIG. 4. FIGS. 6A and 6B are cross-sectional views taken along line VI-VI' of FIG. 4.

Referring to FIGS. 3 to 6B, the display device 100 according to the example embodiment of the present disclosure includes a substrate 110, gate lines GL, data lines DL, high-level supply voltage lines VDDL, a reference line RL, light-emitting elements 160, first transistors 120, second transistors 130, third transistors 140, storage capacitors 150, color filters, a buffer layer 111, a gate insulator 112, a passivation layer 113, and a planarization layer 114. For convenience of illustration, FIG. 4 shows only the data line DL, the gate line GL, the reference line RL, a data branch line DBL, a reference branch line RBL and a first repair bridge line RPBL1. For convenience of illustration, FIGS. 5A and 6B shows only the elements between the substrate 110 and the planarization layer 114 among a variety of elements of the display device 100.

Initially, referring to FIG. 3, a plurality of sub-pixels SP includes a red sub-pixel SPR, a white sub-pixel SPW, a blue sub-pixel SPB and a green sub-pixel SPG, and each of the sub-pixels SP includes an emission area EA and a non-emission area NEA.

The emission area EA can individually emit light of a color, where the light-emitting elements 160 may be disposed. The emission area EA of the red sub-pixel SPR may be a red emission area emitting red light, the emission area EA of the white sub-pixel SPW may be a white emission area emitting white light, the emission area EA of the blue sub-pixel SPB may be a blue emission area emitting blue light, and the emission area EA of the green sub-pixel SPG may be a green emission area emitting green light.

In the non-emission area NEA, a driving circuit for driving the plurality of light-emitting elements 160 is disposed, and a first transistor 120, a second transistor 130, a third transistor 140 and a storage capacitor 150 may be disposed.

The non-emission areas NEA of the red sub-pixel SPR, the white sub-pixel SPW, the blue sub-pixel SPB and the green sub-pixel SPG may have a generally similar structure. It should be noted that the sub-pixels SP forming one pixel PX share signal lines, and thus different sub-pixels may have different structures. Referring to FIG. 3, the red sub-pixel SPR, the white sub-pixel SPW, the blue sub-pixel SPB and the green sub-pixel SPG share the reference line RL. The red sub-pixel SPR and the white sub-pixel SPW share the first high-level supply voltage line VDDL1, and the blue sub-pixel SPB and the green sub-pixel SPG share the second high-level supply voltage line VDDL2. Accordingly, the red sub-pixel SPR and the white sub-pixel SPW make a pair, and the blue sub-pixel SPB and the green sub-pixel SPG make a pair, so that the pairs may have a symmetric structure.

In addition, in order to optimize the ratio between the areas during the circuit design process, the blue sub-pixel SPB and the green sub-pixel SPG may be inverted with respect to the red sub-pixel SPR and the white sub-pixel SPW in the y-axis direction, as shown in FIG. 3. Specifically, the non-emission area NEA may be disposed lower than the emission area EA in the y-axis direction in the red sub-pixel SPR and the white sub-pixel SPW, whereas the non-emission area NEA may be disposed higher than the emission area EA in the y-axis direction in the blue sub-pixel SPB and the green sub-pixel SPG. It is, however, to be understood that the present disclosure is not limited thereto.

Referring to FIG. 3, a plurality of high-level supply voltage lines VDDL, a plurality of data lines DL, and a reference line RL extended in the column direction (y-axis direction) are disposed between a plurality of sub-pixels SP on the substrate 110. The plurality of high-level supply voltage lines VDDL, the plurality of data lines DL and the reference line RL may be disposed on the same layer on the substrate 110 and may be made of the same material. For example, the plurality of high-level supply voltage lines VDDL, the plurality of data lines DL and the reference line RL may be made of, but is not limited to, a conductive material such as copper (Cu), aluminum (Al), molybdenum (Mo), nickel (Ni), titanium (Ti) and chromium (Cr), or an alloy thereof.

The plurality of high-level supply voltage lines VDDL transmit a supply voltage signal to the plurality of sub-pixels SP, and includes a first high-level supply voltage line VDDL1 and a second high-level supply voltage line VDDL2. Two sub-pixels SP adjacent to each other in the row direction (x-axis direction) may share one of the high-level supply voltage lines VDDL. For example, the first high-level supply voltage line VDDL1 may be disposed on the left side of the red sub-pixel SPR to transmit a supply voltage signal to the first transistor 120 of each of the red sub-pixel SPR and the white sub-pixel SPW. The second high-level supply voltage line VDDL2 may be disposed on the right side of the green sub-pixel SPG to transmit a supply voltage signal to the first transistor 120 of each of the blue sub-pixel SPB and the green sub-pixel SPG.

The plurality of data lines DL transmits a data signal to each of the plurality of sub-pixels SP, and includes a first data line DL1, a second data line DL2, a third data line DL3 and a fourth data line DL4. The first data line DL1 may be disposed between the red sub-pixel SPR and the white sub-pixel SPW, i.e., on the right side of the red sub-pixel SPR, to transmit a data signal to the second transistor 130 of the red sub-pixel SPR. The second data line DL2 may be disposed between the first data line DL1 and the white sub-pixel SPW, i.e., on the left side of the white sub-pixel SPW, to transmit a data signal to the second transistor 130 of the white sub-pixel SPW. The third data line DL3 may be disposed between the blue sub-pixel SPB and the green sub-pixel SPG, i.e., on the right side of the blue sub-pixel SPB, to transmit a data signal to the second transistor 130 of the blue sub-pixel SPB. The fourth data line DL4 may be disposed between the third data line DL3 and the green sub-pixel SPG, i.e., on the left side of the green sub-pixel SPG, to transmit a data signal to the second transistor 130 of the green sub-pixel SPG.

The reference line RL transmits a reference signal to each of the plurality of sub-pixels SP, and may be disposed between the white sub-pixel SPW and the blue sub-pixel SPB. A plurality of sub-pixels SP forming a pixel may share a single reference line RL. The reference line RL may transmit a reference signal to the third transistor 140 of each of the red sub-pixel SPR, the white sub-pixel SPW, the blue sub-pixel SPB and the green sub-pixel SPG.

The buffer layer 111 may be disposed on the plurality of high-level supply voltage line VDDL, the plurality of data lines DL, and the reference line RL. The buffer layer 111 can prevent permeation of moisture or impurities through the substrate 110. The buffer layer 111 may be made up of, but is not limited to, a single layer of silicon oxide (SiOx) or silicon nitride (SiNx) or multiple layers thereof. It should be noted that the buffer layer 111 may be eliminated depending on the type of the substrate 110 or the type of the thin-film transistor, and is not limited to the above-described configuration.

The first transistor 120 is disposed in the non-emission area NEA of each of the red sub-pixel SPR, the white sub-pixel SPW, the blue sub-pixel SPB, and the green sub-pixel SPG. The first transistor 120 includes a first gate electrode 121, a first source electrode 122, a first drain electrode 123 and a first active layer 124. The first transistor 120 electrically connected to the first electrode of the light-emitting element 160 and the high-level supply voltage line VDDL may be a driving transistor DT.

Initially, the first drain electrode 123 may be disposed on the buffer layer 111. The first drain electrode 123 is electrically connected to the plurality of high-level supply voltage lines VDDL. Specifically, the first drain electrode 123 of each of the red sub-pixel SPR and the white sub-pixel SPW may be electrically connected to the first high-level supply voltage line VDDL1 through a contact hole formed in the buffer layer 111, and the first drain electrode 123 of each of the blue sub-pixel SPB and the green sub-pixel SPG may be electrically connected to the second high-level supply voltage line VDDL2 through a contact hole formed in the buffer layer 111. That is to say, the first drain electrode 123 of each of the red sub-pixel SPR and the white sub-pixel SPW may be formed integrally with a first high-level supply voltage branch line VDDBL1 extended from the first high-level supply voltage line VDDL1, and the first drain electrode 123 of each of the blue sub-pixel SPB and the green sub-pixel SPG may be formed integrally with a second high-level supply voltage branch line VDDBL2 extended from the second high-level supply voltage line VDDL2.

A first active layer 124 may be disposed on the buffer layer 111. The first active layer 124 may be made of, but is not limited to, a semiconductor material such as oxide semiconductor, amorphous silicon and polysilicon. For example, when the first active layer 124 is formed of an oxide semiconductor, the first active layer 124 may include a channel region, a source region and a drain region, and the source region and the drain region may be formed by making the material contained in the first active layer 124 conductive. Alternatively, an auxiliary metal layer or a transparent oxide layer may be further disposed on certain regions of the first active layer 124 to form conductive regions. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

The first drain electrode 123 of the red sub-pixel SPR and the first drain electrode 123 of the white sub-pixel SPW may be formed integrally. The first drain electrode 123 of the blue sub-pixel SPB and the first drain electrode 123 of the green sub-pixel SPG may be formed integrally. Specifically, the first drain electrode 123 in the red sub-pixel SPR and the first drain electrode 123 in the white sub-pixel SPW may be formed integrally to share one first high-level supply voltage line VDDL1. For example, the supply voltage signal from the first high-level supply voltage line VDDL1 may be transmitted to the first drain electrode 123 of the white sub-pixel SPW through the first drain electrode 123 of the red sub-pixel SPR. The supply voltage signal from the second high-level supply voltage line VDDL2 may be transmitted to the first drain electrode 123 of the blue sub-pixel SPB through the first drain electrode 123 of the green sub-pixel SPG. It should be understood, however, that the present disclosure is not limited thereto. The first drain electrode 123 in the red sub-pixel SPR and the first drain electrode 123 in the white sub-pixel SPW may be formed separately, and the first drain electrode 123 in the blue sub-pixel SPB and the first drain electrode 123 in the green sub-pixel SPG may also be formed separately.

The first active layer 124 and the first drain electrode 123 of each of the red sub-pixel SPR, the white sub-pixel SPW, the blue sub-pixel SPB and the green sub-pixel SPG may be formed integrally. For example, when a voltage is applied to the first gate electrode 121 in the red sub-pixel SPR, the first drain electrode 123 that is formed integrally with the first active layer 124 and is formed by making the first active 124 conductive may transmit a supply voltage signal from the first high-level supply voltage line VDDL1 to the first active layer 124 and the first source electrode 122. The first drain electrode 123 may be formed integrally with the first high-level supply voltage line VDDL1, but the present disclosure is not limited thereto.

The gate insulator 112 may be disposed on the first active layer 124. The gate insulator 112 may electrically insulate the first gate electrode 121 from the first active layer 124. The gate insulator 112 may be disposed only in line with the first gate electrode 121 and conductive layers formed via the same process using the same material as the first gate electrode 121. For example, the gate insulator 112 may be disposed on the entire surface of the substrate 110, and then may be removed together with the first gate electrode 121 and the conductive layers disposed on the gate insulator 112 when they are patterned. The gate insulator 112 may be made up of, but is not limited to, a single layer of an insulating material, e.g., silicon oxide (SiOx) or silicon nitride (SiNx) or multiple layers thereof.

The first gate electrode 121 may be disposed on the gate insulator 112 so that it overlaps with the first active layer 124 in each of the red sub-pixel SPR, the white sub-pixel SPW, the blue sub-pixel SPB and the green sub-pixel SPG. The first gate electrode 121 may be made of, but is not limited to, a conductive material, e.g., copper (Cu), aluminum (Al), molybdenum (Mo), nickel (Ni), titanium (Ti), chromium (Cr), or an alloy thereof.

The first source electrode 122 spaced apart from the first gate electrode 121 is disposed on the gate insulator 112 in each of the red sub-pixel SPR, the blue sub-pixel SPB and the green sub-pixel SPG. The first source electrode 122 may be electrically connected to the first active layer 124 through a contact hole formed in the gate insulator 112. The first source electrode 122 may be disposed on the same layer as the first gate electrode 121 and may be made of the same material, but the present disclosure is not limited thereto. The first source electrode 122 may be made of, but is not limited to, a conductive material, e.g., copper (Cu), aluminum (Al), molybdenum (Mo), nickel (Ni), titanium (Ti), chromium (Cr), or an alloy thereof.

The second transistor 130 is disposed in the non-emission area NEA of each of the plurality of sub-pixels SP. The second transistor 130 includes a second gate electrode 131, a second source electrode 132, a second drain electrode 133 and a second active layer 134. The second transistor 130 electrically connected to the gate line GL, the data line DL and the first gate electrode 121 of the first transistor 120 may be a switching transistor SWT (see FIG. 2).

Initially, the second drain electrode 133 may be disposed between the substrate 110 and the buffer layer 111 in each of the plurality of sub-pixels SP. The second drain electrode 133 is electrically connected to one of the plurality of data lines DL. The second drain electrode 133 may be formed integrally with the plurality of data lines DL and may be made of the same material as the plurality of data lines DL. It should be understood, however, that the present disclosure is not limited thereto. As shown in FIG. 3, the second drain electrode 133 may be formed of a plurality of data lines DL and data branch lines DBL connected through contact holes and may be disposed on the same layer as and made of the same material the first drain electrode 123. Specifically, like the first drain electrode 123, the second drain electrode 133 may be formed by making a region of the second active layer 134 conductive.

The second source electrode 132 spaced apart from the second drain electrode 133 is disposed in each of the plurality of sub-pixels SP. The second source electrode 132 may be the same node as the first gate electrode 121 of the first transistor 120. The second source electrode 132 may be the same layer as the first gate electrode 121 or as the same layer as the second drain electrode 133. When the second source electrode 132 is the same layer as the first gate electrode 121, the second source electrode 132 may be made of, but is not limited to, a conductive material, for example, copper (Cu), aluminum (Al), molybdenum (Mo), nickel (Ni), titanium (Ti), chromium (Cr) or an alloy thereof. When the second source electrode 132 is the same layer as the second drain electrode 133, the second source electrode 132 may be formed by making a region of the second active layer 134 conductive, like the second drain electrode 133.

The second active layer 134 may be disposed on the buffer layer 111 in each of the plurality of sub-pixels SP. The second active layer 134 may be electrically connected to the second source electrode 132 and the second drain electrode 133. The second active layer 134 may be made of, but is not limited to, a semiconductor material such as oxide semiconductor, amorphous silicon and polysilicon. An auxiliary metal layer or a transparent oxide layer may be further disposed on certain regions of the second active layer 134 to form conductive regions. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

The second gate electrode 131 may be disposed on the gate insulator 112 to overlap the second active layer 134 in each of the plurality of sub-pixels SP. The second gate electrode 131 may be made of, but is not limited to, a conductive material, e.g., copper (Cu), aluminum (Al), molybdenum (Mo), nickel (Ni), titanium (Ti), chromium (Cr), or an alloy thereof.

The second gate electrode 131 may be the gate line GL. That is to say, a part of the gate line GL may work as the second gate electrode 131. The gate line GL may be made of, but is not limited to, a conductive material, e.g., copper (Cu), aluminum (Al), molybdenum (Mo), nickel (Ni), titanium (Ti), chromium (Cr), or an alloy thereof.

The gate line GL transmits a gate signal to each of the plurality of sub-pixels SP, and is extended across the plurality of sub-pixels SP in the row direction. For example, the gate line GL may be extended in the row direction between the non-emission area NEA and the emission area EA of each of the plurality of sub-pixels SP, and may cross the high-level supply voltage lines VDDL, the data lines DL and the reference line RL extended in the column direction.

The third transistor 140 is disposed in the non-emission area NEA of each of the plurality of sub-pixels SP. The third transistor 140 includes a third gate electrode 141, a third source electrode 142, a third drain electrode 143 and a third active layer 144. The third transistor 140 electrically connected to the reference line RL, the gate line GL, and the second capacitor electrode 152 of the storage capacitor 150 may be a sensing transistor SET.

Initially, the third source electrode 142 may be disposed between the substrate 110 and the buffer layer 111 in each of the plurality of sub-pixels SP. The third source electrode 142 may be disposed on the same layer as the plurality of high-level supply voltage lines VDDL, the plurality of data lines DL, and the reference line RL, and may be made of the same material. The third source electrode 142 may be made of, but is not limited to, a conductive material, e.g., copper (Cu), aluminum (Al), molybdenum (Mo), nickel (Ni), titanium (Ti), chromium (Cr), or an alloy thereof.

In addition, the third source electrode 142 may be electrically connected to the second capacitor electrode 152 forming the storage capacitor 150, which will be described later.

The third source electrode 142 may work as a light-blocking layer that blocks light incident on the first active layer 124 of the first transistor 120. For example, if light is irradiated onto the first active layer 124, a leakage current may be generated, thereby reducing the reliability of the first transistor 120. The third source electrode 142 made of a non-transparent conductive material is disposed under the first active layer 124 and the first gate electrode 121, and can block the light incident on the first active layer 124 from below the substrate 110. In this manner, the reliability of the first transistor 120 can be improved.

The third active layer 144 may be disposed on the buffer layer 111 in each of the plurality of sub-pixels SP. The third active layer 144 may be electrically connected to the third source electrode 142 through a contact hole formed in the buffer layer 111. The third active layer 144 may be made of, but is not limited to, a semiconductor material such as oxide semiconductor, amorphous silicon and polysilicon. An auxiliary metal layer or a transparent oxide layer may be further disposed on certain regions of the third active layer 144 to form conductive regions. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

The third gate electrode 141 may be disposed on the gate insulator 112 to overlap the third active layer 144 in each of the plurality of sub-pixels SP. The third gate electrode 141 may be the gate line GL. That is to say, a part of the gate line GL may work as the third gate electrode 141. The third gate electrode 141 may be made of, but is not limited to, a conductive material, e.g., copper (Cu), aluminum (Al), molybdenum (Mo), nickel (Ni), titanium (Ti), chromium (Cr), or an alloy thereof.

The third drain electrode 143 is disposed on the gate insulator 112 in each of the plurality of sub-pixels SP. The third drain electrode 143 may be electrically connected to the third active layer 144 through a contact hole formed in the gate insulator 112. The third drain electrode 143 may be made of a conductive material, e.g., copper (Cu), aluminum (Al), molybdenum (Mo), nickel (Ni), titanium (Ti), chromium (Cr), or an alloy thereof. It should be understood, however, that the present disclosure is not limited thereto. The third drain electrode 143 may be formed of the reference branch line RBL connected to the reference line RL through a contact hole and may be disposed on the same layer and made of the same material as the second drain electrode 133, as shown in FIG. 3.

That is to say, the third drain electrode 143 is electrically connected to the reference line RL. Although the third drain electrode 143 may be formed integrally with the reference line RL and may be made of the same material as the reference line RL, the third drain electrode 143 may be formed of the reference branch line RBL connected to the reference line RL through a contact hole, may be formed on the same layer and may be made of the same material as the first drain electrode 123, as shown in FIG. 3. Specifically, like the second drain electrode 133, the third drain electrode 143 may be formed by making a region of the third active layer 134 conductive.

The storage capacitor 150 is disposed in the non-emission area NEA of each of the red sub-pixel SPR, the white sub-pixel SPW, the blue sub-pixel SPB, and the green sub-pixel SPG. The storage capacitor 150 may store the voltage between the first gate electrode 121 and the first source electrode 122 of the first transistor 120 so that the light-emitting element 160 remains in the same state for one frame. The storage capacitor 150 includes a first capacitor electrode 151 and a second capacitor electrode 152.

The first capacitor electrode 151 is disposed between the substrate 110 and the buffer layer 111 in each of the red sub-pixel SPR, the blue sub-pixel SPB and the green sub-pixel SPG. The first capacitor electrode 151 may be disposed closest to the substrate 110 among the conductive elements disposed on the substrate 110. Accordingly, the distance between the first capacitor electrode 151 and the second capacitor electrode 152 is increased so that it is possible to suppress parasitic capacitance that may occur between the first capacitor electrode 151 and the second capacitor electrode 152.

The first capacitor electrode 151 may be formed integrally with the second source electrode 132 to be electrically connected to the second source electrode 132. In addition, the first capacitor electrode 151 may be electrically connected to the first gate electrode 121 through a contact hole formed in the buffer layer 111. That is to say, the second source electrode 132 of the second transistor 130 and the first gate electrode 1211 of the first transistor 120 may be electrically connected through the first capacitor electrode 151. The first capacitor electrode 151 formed integrally with the second source electrode 132 may be made of the same material as the second source electrode 132. As shown in FIG. 3, like the second source electrode 132, the first capacitor electrode 151 may be formed by making a region of the second active layer 134 conductive. Alternatively, when the second source electrode 132 is a metal layer, the first capacitor electrode 151 may be made of, but is not limited to, a conductive material, e.g., copper (Cu), aluminum (Al), molybdenum (Mo), nickel (Ni), titanium (Ti), chromium (Cr), or an alloy thereof.

In this instance, the first capacitor electrode 151 is disposed lower than the first gate electrode 121 and the first source electrode 122. The first capacitor electrode 151 is disposed to overlap the first source electrode 122.

A second capacitor electrode 152 is disposed on the gate insulator 112 in each of the red sub-pixel SPR, the blue sub-pixel SPB and the green sub-pixel SPG. The second capacitor electrode 152 may be disposed on the first capacitor electrode 151 so that it overlaps with the first capacitor electrode 151. In this instance, an insulating layer may be disposed between the second capacitor electrode 152 and the first capacitor electrode 151.

The second capacitor electrode 152 can prevent light leakage in the non-emission areas NEA of each of the red sub-pixel SPR, the white sub-pixel SPW, the blue sub-pixel SPB and the green sub-pixel SPG. Specifically, in the emission area EA of each of the red sub-pixel SPR, the blue sub-pixel SPB and the green sub-pixel SPG, color filters associated with the respective pixels are disposed, so that white light emitted from the light-emitting elements 160 may be converted into red, blue, or green. If undesirable light is emitted from the non-emission area NEA of each of the red sub-pixel SPR, the blue sub-pixel SPB and the green sub-pixel SPG, the light emitted from the emission area EA and the light from the non-emission area NEA may be mixed, and thus the color coordinates of each sub-pixel SP may be shifted. In this regard, the second capacitor electrode 152 may be made of a non-transparent conductive material and disposed under the light-emitting elements 160. Accordingly, even if undesirable light is emitted from the circuitry of each of the red sub-pixel SPR, the blue sub-pixel SPB and the green sub-pixel SPG, it is possible to block the light emitted from the circuitry from passing through the substrate 110 by the second capacitor electrode 152. In this manner, it is possible to prevent light leakage from the circuitry, and to improve the color purity in each of the sub-pixels SP.

The second capacitor electrode 152 may be formed integrally with the first source electrode 122 to be electrically connected to the first source electrode 122. A part of the first source electrode 122 that overlaps with the first capacitor electrode 151 may be referred to as the second capacitor electrode 152. The second capacitor electrode 152 formed integrally with the first source electrode 122 may be made of the same material as the first source electrode 122, for example, it may be made of a conductive material such as copper (Cu), aluminum (Al), molybdenum (Mo), nickel (Ni), titanium (Ti) and chromium (Cr), or an alloy thereof. It should be understood, however, that the present disclosure is not limited thereto.

In summary, the first capacitor electrode 151 of the storage capacitor 150 may be formed integrally with the second source electrode 132, and may be electrically connected to the first gate electrode 121 of the first transistor 120 and the second source electrode 132 of the second transistor 130. In addition, the second capacitor electrode 152 may be formed integrally with the first source electrode 122, and may be electrically connected to the first source electrode 122 of the first transistor 120 and the third source electrode 142 of the third transistor 140.

Subsequently, the passivation layer 113 may be disposed on the first transistor 120, the second transistor 130, the third transistor 140, the storage capacitor 150, a plurality of high-level supply voltage lines VDDL, a plurality of data lines DL, the reference line RL and the gate line GL. The passivation layer 113 is an insulating layer for protecting the elements under it. For example, the passivation layer 113 may be made up of, but is not limited to, a single layer of silicon oxide (SiOx) or silicon nitride (SiNx) or multiple layers thereof. In some embodiments of the present disclosure, the passivation layer 113 may be eliminated.

A plurality of color filters is disposed on the passivation layer 113. Specifically, a plurality of color filters may be disposed between the planarization layer 114 and the passivation layer 113. The plurality of color filters includes a red color filter, a green color filter, and a blue color filter. A red color filter is disposed on the emission area EA of the red sub-pixel SPR, a blue color filter is disposed on the emission area EA of the blue sub-pixel SPB, and a green color filter is disposed on the emission area EA of the green sub-pixel SPG. It should be noted that the plurality of color filters is not disposed on the emission area EA of the white color filter SPW. The area of the color filters is not depicted in FIG. 3 for convenience of illustration.

The planarization layer 114 may be disposed on the passivation layer 113 and the color filters. The planarization layer 114 is an insulating layer that provides a flat surface over the first transistor 120, the second transistor 130, the third transistor 140, the storage capacitor 150, a plurality of high-level supply voltage lines VDDL, a plurality of data lines DL, the reference line RL and the gate line GL disposed on the substrate 110. The planarization layer 114 may be made of an organic material, and may be made up of a single layer or multiple layers of polyimide or photo acryl, for example. It should be understood, however, that the present disclosure is not limited thereto.

The light-emitting element 160 is disposed in each of the plurality of sub-pixels SP. The light-emitting element 160 is disposed on the planarization layer 114 in each of the plurality of sub-pixels SP. The light-emitting element 160 includes a first electrode, an emissive layer, and a second electrode. The light-emitting element 160 emits light in the emission area that is surrounded by a bank BNK. In other words, light can be emitted only in a region of the first electrode of the light-emitting element 160 that is not covered by the bank BNK.

The first electrode is disposed on the planarization layer 114 in the emission area EA. Since the first electrode supplies holes to the emissive layer, it is made of a conductive material having a high work function, and may be referred to as an anode. The first electrode may be made of, for example, a transparent conductive material such as indium tin oxide (ITO) and indium zinc oxide (IZO). It should be understood, however, that the present disclosure is not limited thereto.

Incidentally, when the display device 100 according to the example embodiment of the present disclosure has a top-emission architecture, a reflective layer made of a metal material having excellent reflection efficiency, for example, aluminum (Al) or silver (Ag), may be added under the first electrode so that the light emitted from the emissive layer is reflected by the first electrode travels toward the upper side, i.e., toward the second electrode. On the contrary, when the display device 100 has a bottom-emission architecture, the first electrode may be made only of a transparent conductive material. In the following description, it is assumed that the display device 100 has a bottom-emission architecture.

The emissive layer is disposed on the first electrode in the emission area EA and the non-emission area NEA. The emissive layer may be formed as a single layer across the plurality of sub-pixels SP. In other words, the emissive layer of each of the plurality of sub-pixels SP may be connected to one another and formed integrally. The emissive layer may be made up of a single emissive layer or a stack of multiple layers that emit lights of different colors. The emissive layer may further include an organic layer such as a hole injection layer, a hole transport layer, an electron transport layer, and an electron injection layer.

The second electrode is disposed on the emissive layer in the emission area EA and the non-emission area NEA. Since the second electrode supplies electrons to the emissive layer, it is made of a conductive material having a low work function, and may be referred to as a cathode. The second electrode may be formed as a single layer over the plurality of sub-pixels SP. That is to say, the second electrodes of the plurality of sub-pixels SP may be connected to one another and formed integrally. The second electrode may be made of, for example, a transparent conductive material such as indium tin oxide (ITO) and indium zinc oxide (IZO) or a ytterbium (Yb) alloy, and may further include a metal doped layer. It should be understood, however, that the present disclosure is not limited thereto. Incidentally, although not shown in FIGS. 3 to 5, the second electrode of the light-emitting element 160 may be electrically connected to a low-level supply voltage line to receive a low-level supply voltage.

The light-emitting element 160 includes an extension extended from the first electrode toward the non-emission area NEA. The extension may be extended from the first electrode of the emission area EA toward the first source electrode 122 of the non-emission area NEA and may be electrically connected to the first source electrode 122 through a contact hole formed in the planarization layer 114 and the passivation layer 113. Accordingly, the first electrode of the light-emitting element 160 may be electrically connected to the first source electrode 122 of the first transistor 120 which is the second capacitor electrode 152 of the storage capacitor 150 through the extension.

Next, the first repair bridge line RPBL1 will be described with reference to FIGS. 3 to 6B.

Initially, the gate line GL disposed in the non-emission area NEA is a line that transmits a gate signal to each of the plurality of sub-pixels SP, and is extended across the plurality of sub-pixels SP in the row direction. Since a scan signal is sequentially supplied to the gate line GL under the control of the timing controller, the gate line GL may also be referred to as a scan line. As shown in FIG. 3, according to the example embodiment of the present disclosure, a one-scan line structure in which the second transistor 130 and the third transistor 140 operate on one gate line GL is mainly described. It should be understood, however, that a two-scan line structure with two gate lines GL may be equally employed.

When a defect occurs in such a gate line GL, e.g., the gate line GL is open, a repair process may be carried out on the gate line GL to cut the both sides of the location where the defect has occurred. After the repair process on the gate line GL is carried out and the gate line GL is disconnected, a gate signal is transmitted to the next pixel PX of the defective pixel PX. Therefore, a bypass line for the gate line GL is configured to transmit the gate signal.

In view of the above, the display device 100 according to the example embodiment includes a repair bridge line RPBL working as a bypass line for transmitting a gate signal in the repair process on the gate line GL. The repair bridge line RPBL may be electrically connected to at least one of a plurality of signal lines crossing the gate line GL. The plurality of signal lines includes high-level supply voltage lines VDDL, data lines DL, and reference lines RL disposed in the non-emission area.

Since the repair bridge line RPBL has to work as a bypass line for transmitting a gate signal, it may be electrically connected to the gate line GL. It should be noted that the repair bridge line RPBL may be connected to the signal lines such as the high-level supply voltage lines VDDL and the reference lines RL, and may be formed on a different layer from the gate line GL. This is because the non-emission area NEA may be increased if the bypass line is formed of the same material on the same layer as the gate line GL.

In addition, the repair bridge line RPBL is not electrically connected to the gate line GL before the repair process, but may be electrically connected to the gate line GL after the repair process. That is to say, after a welding process included in the repair process has been carried out, the repair bridge line RPBL may be electrically connected to the gate line GL to transmit the signal. A location where the signal line connected to the repair bridge line RPBL overlaps with the gate line GL and a location where the signal line connected to the repair bridge line RPBL overlaps with it may be referred to as welding spots W. The lines disposed at the welding spots W may be electrically connected by being welded by a laser irradiated during the laser repair process. Specifically, the repair process may be carried out by irradiating the welding spots W with a laser beam, removing an insulating film existing between the lines disposed at the welding spots W, and forming an electrical connection between the lines. That is to say, the repair bridge line RPBL may be electrically connected to the gate line GL via the welding process, and may become a bypass line of a defective pixel for transmitting a gate signal.

If a defect occurs in a pixel, the repair bridge line RPBL has to transmit a gate signal to the next pixel. Therefore, the repair bridge line RPBL may be disposed across the red sub-pixel SPR, the white sub-pixel SPW, the green sub-pixel SPG and the blue sub-pixel SPB. In addition, the repair bridge line RPBL may be electrically connected to the high-level supply voltage line VDDL intersecting the gate line GL. That is to say, one end of the repair bridge line RPBL may be connected to the first high-level supply voltage line VDDL1, the other end thereof may be connected to the second high-level supply voltage line VDDL2, and may be disposed across the plurality of sub-pixels SP.

In particular, the display device 100 according to the example embodiment includes a first repair bridge line RPBL1 that is an example of the repair bridge line RPBL.

The first repair bridge line RPBL1 may be connected to the high-level supply voltage line VDDL to cross the emission area EA of each of the plurality of sub-pixels SP. That is to say, as described above, one end of the first repair bridge line RPBL may be connected to the first high-level supply voltage line VDDL1, the other end thereof may be connected to the second high-level supply voltage line VDDL2, and may be disposed on the emission area EA between the one end and the other end.

The first repair bridge line RPBL1 may be formed of the same material on the same layer as the plurality of active layers 124, 134 and 144. The first repair bridge line RPBL1 may include, but is not limited to, a semiconductor layer such as an oxide semiconductor, amorphous silicon, and polysilicon. In addition, an auxiliary metal layer or a transparent oxide may be further disposed on certain regions of the semiconductor layer to make it conductive. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

When the first repair bridge line RPBL1 includes a stack structure in which a semiconductor layer and an auxiliary metal layer are stacked on one another at at least some regions, a part of the first repair bridge line RPBL1 that overlaps with the emission area EA may be disposed with the stack structure in which only the semiconductor layer is formed to be conductive because the first repair bridge line RPBL1 should be disposed on the emission area EA.

When the first repair bridge line RPBL1 includes the stack structure of the semiconductor layer and the transparent oxide layer at at least some regions, the first repair bridge line RPBL1 has transparency in the entire region. Accordingly, by disposing the stack structure of the semiconductor layer and the transparent oxide layer on the emission area EA, it is possible to design the first repair bridge line RPBL1 freely as a conductive line.

Referring to FIGS. 4 to 6B, the display device 100 according to the example embodiment of the present disclosure may include welding spots W for conducting a repair process. The welding spots W may include a first welding spot W1, a second welding spot W2, a third welding spot W3, and a fourth welding spot W4. At the first welding spot W1, the gate line GL and the first high-level supply voltage line VDDL1 may overlap each other. At the fourth welding spot W4, the gate line GL and the second high-level supply voltage line VDDL2 may overlap each other. At the second welding spot W2, the first high-level supply voltage line VDDL1 and the first repair bridge line RPBL1 may overlap each other. At the third welding spot W3, the second high-level supply voltage line VDDL2 and the first repair bridge line RPBL1 may overlap each other.

FIG. 5A shows the structure in which the first high-level supply voltage line VDDL1, the first repair bridge line RPBL1 and the connection electrode CE for electrical connection overlap one another at the second welding spot W2 before the repair process is carried out. FIG. 5B shows the structure after the repair process has been carried out. The connection electrode CE may be electrically connected to the first repair bridge line RPBL1 through a contact hole, and may be connected to the first high-level supply voltage line VDDL1 through another contact hole. The connection electrode CE may be formed on the same layer and made of the same material as the gate line GL. Referring to FIG. 5B, after the repair process by laser is carried out, the first high-level supply voltage line VDDL1 and the first repair bridge line RPBL1 are electrically connected with each other. That is to say, by irradiating the second welding spot W2 with laser, a buffer layer between the first high-level supply voltage line VDDL1 and the first repair bridge line RPBL1 is partially removed so that the first high-level supply voltage line VDDL1 is in contact with the first repair bridge line RPBL1. The welding process conducted at the second welding spot W2 may be substantially equally applied to the third welding spot W3.

FIG. 6A shows a structure in which the first high-level supply voltage line VDDL1 and the gate line GL overlap each other at the first welding spot W1 before a repair process is carried out. FIG. 6B shows the structure after the repair process has been carried out. Referring to FIG. 6B, after the repair process by laser has been carried out, the first high-level supply voltage line VDDL1 and the gate line GL are electrically connected with each other. That is to say, by irradiating the first welding spot W1 with laser, an insulating layer between the first high-level supply voltage line VDDL1 and the gate line GL is partially removed so that the first high-level supply voltage line VDDL1 is in contact with the gate line GL. The welding process conducted at the first welding spot W1 may be substantially equally applied to the fourth welding spot W4.

That is to say, at the first welding spot W1 and the fourth welding spot W4, the first high-level supply voltage line VDDL1 and the second high-level supply voltage line VDDL2 may be electrically connected with the gate line GL by the welding process, respectively. At the second welding spot W2 and the third welding spot W3, the first high-level supply voltage line VDDL1 and the second high-level supply voltage line VDDL2 may be electrically connected with the first repair bridge line RPBL1, respectively, by the welding process.

As a result, if a defect occurs in a gate line GL disposed in the plurality of sub-pixels SP, the high-level supply voltage line VDDL and the gate line GL close to the defective location may be welded, and the high-level supply voltage line VDDL and the first repair bridge line RPBL1 may be welded. Additionally, by cutting a part of the upper and lower portions of the high-level supply voltage line VDDL subjected to the welding process as indicated in FIG. 4, the first repair bridge line RPBL1 may become the bypass line for transmitting a gate signal. That is to say, referring to the line indicating transmission of a gate signal Gate in FIG. 4, even though the gate signal transmitted from the gate line GL is interrupted at the location where the defect occurs, the gate signal may be transmitted to the first high-level supply voltage line VDDL1 through the first welding spot W1, the gate signal may be transmitted to the first repair bridge line RPBL1 through the second welding spot W2, the gate signal may be transmitted to the second high-level supply voltage line VDDL2 through the third welding spot W3, and the gate signal may be transmitted to the gate line GL of the next pixel through the fourth welding spot W4.

Figure 7:
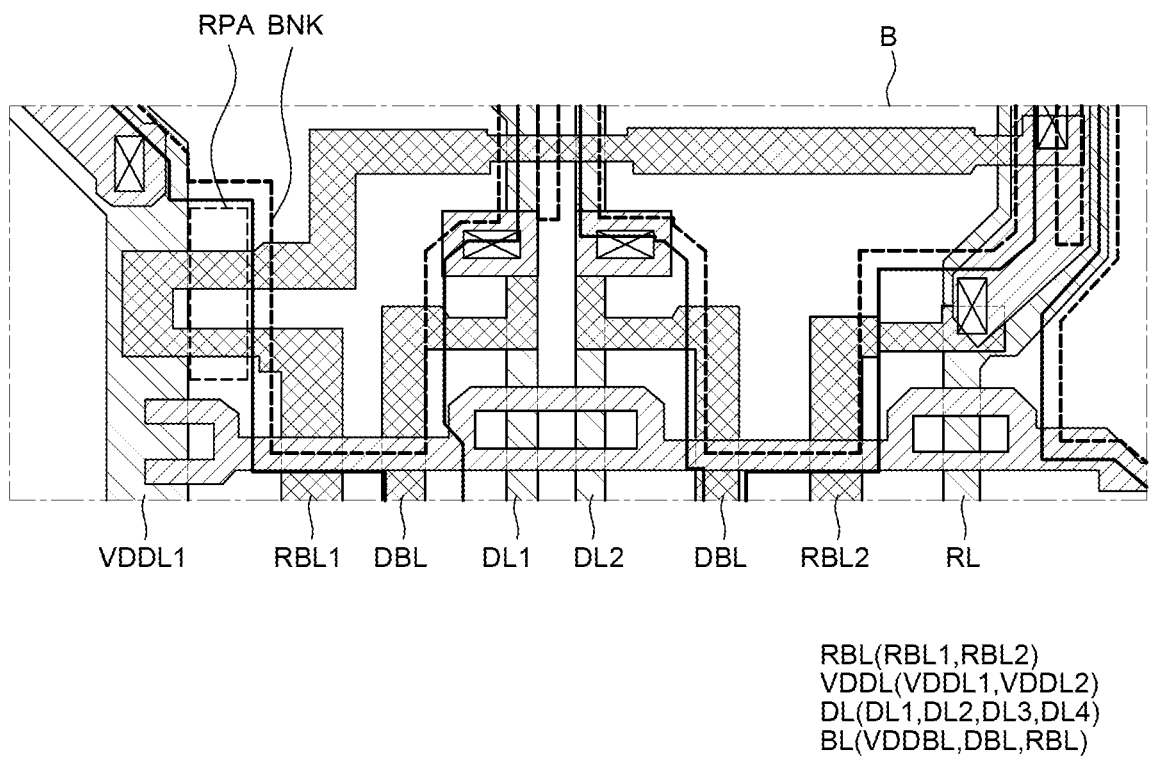
FIG. 7 is an enlarged view of area B of FIG. 3.

Next, FIG. 7 is an enlarged view of area B of FIG. 3. For convenience of illustration, FIG. 7 shows only a first high-level supply voltage line VDDL1, a first data line DL1, a second data line DL2, a reference line RL, a data branch line DBL, a bank BNK and a reference branch line RBL.

The non-emission area NEA may include signal lines that cross the gate line GL and are extended in the y-axis direction. The signal lines crossing the gate line GL may include the first high-level supply voltage line VDDL1, the second high-level supply voltage line VDDL2, a plurality of data lines DL and the reference line RL.

Since the signal lines transmit signals to the plurality of sub-pixels SP, branch lines BL is extended from the respective signal lines. The branch lines BL may include a first high-level supply voltage branch line VDDBL1 extended from the first high-level supply voltage line VDDL1, a second high-level supply voltage branch line VDDBL2 extended from the second high-level supply voltage line VDDL2, a data branch line DBL extended from a data line DL, and first and second reference branch lines RBL1 and RBL2 extended from the reference line RL. The first high-level supply voltage branch line VDDBL1 and the second high-level supply voltage branch line VDDBL2 may be connected to the first high-level supply voltage line VDDL1 and the second high-level supply voltage line VDDL2, respectively, to apply the high-level voltage to the plurality of sub-pixels SP. The data branch line DBL may be connected to the plurality of data lines DL to apply a data voltage to the plurality of sub-pixels SP, and the first and second reference branch lines RBL1 and RBL2 may be connected to the reference line RL to apply a reference voltage to the plurality of sub-pixels SP.

The branch lines BL may be formed integrally with and extended from the respective signal lines electrically connected thereto. In this instance, the branch lines BL are disposed on the same layer and are made of the same material as the signal lines, the branch lines BL may be made of, but is not limited to, a conductive material, such as copper (Cu), aluminum (Al), molybdenum (Mo), nickel (Ni), titanium (Ti), chromium (Cr), or an alloy thereof. It is to be understood that the branch lines BL may be formed on a layer different from that of the signal lines and may be electrically connected thereto through contact holes. In particular, as shown in FIG. 7, the branch lines BL may be formed of the same material on the same layer as the plurality of active layers 124, 134 and 144 and may have some conductive regions. That is to say, the branch lines BL may include, but is not limited to, a semiconductor layer such as an oxide semiconductor, amorphous silicon, and polysilicon. In addition, the branch lines BL may further include an auxiliary metal layer or a transparent oxide disposed on certain regions of the semiconductor layer to make it conductive. In this instance, the auxiliary metal layer may be made of an opaque metal layer such as molybdenum-titanium (MoTi), and the transparent oxide layer may be made of a transparent conductive material such as tin oxide (TO), indium tin oxide (ITO), indium zinc oxide (IZO) and indium tin zinc oxide (ITZO). It should be understood, however, that the present disclosure is not limited thereto.

When the branch line BL includes the stack structure in which a semiconductor layer and an auxiliary metal layer are stacked on one another at at least some regions, a part of the branch line BL that overlaps with the emission area EA may be disposed with the stack structure in which only the semiconductor layer is made conductive because the branch line BL should be disposed on the emission area EA. When the branch line BL includes the stack structure of the semiconductor layer and the transparent oxide layer at at least some regions, the branch line BL has transparency in the entire region. Accordingly, by disposing the stack structure of the semiconductor layer and the transparent oxide layer on the emission area EA, it is possible to design the branch line BL freely as a conductive line.

In view of the above, in the display device 100 according to the example embodiment of the present disclosure, the shape of the first reference branch line RBL1 among the branch lines BL is changed so that a repair area RPA of the reference line RL can be disposed at an appropriate location. The reference branch line RBL may include a first reference branch line RBL1 and a second reference branch line RBL2. The first reference branch line RBL1 may be extended from the reference line RL to transmit a reference voltage signal to the red sub-pixel SPR or the green sub-pixel SPG. The second reference branch line RBL2 may be extended from the reference line RL to transmit a reference voltage signal to the white sub-pixel SPW or the blue sub-pixel SPB. As the reference line RL is disposed between the white sub-pixel SPW and the blue sub-pixel SPB, the first reference branch line RBL1 needs to be extended long from the reference line RL. As the first reference branch line RBL1 is extended to transmit a signal to the red sub-pixel SPR, it may be disposed in a C-shape on the upper side of the first high-level supply voltage line VDDL1.

In addition, the reference branch line RBL may include a repair area RPA to disconnect the reference line RL if a defect occurs in a pixel. The repair area RPA of the reference branch line RBL may be located in the non-emission area NEA because a repair process is carried out and laser processing is conducted. In addition, the repair area RPA of the reference branch line RBL may be a full-tone area. Specifically, in the process of patterning the reference branch line RBL, a halftone mask may be used. Since the halftone mask may include a light-blocking portion, a light-transmitting portion and a semi-transmissive portion, a full-tone area and a halftone area may be formed depending on the areas. Since the repair process for the reference branch line RBL must be conducted in the full-tone area, the repair area RPA may be formed as a full-tone area.

The repair area RPA of the reference branch line RBL formed as the full-tone area may be located at the C-shaped area on the upper side of the first high-level supply voltage line VDDL1. That is to say, the repair area RPA of the first reference branch line RBL1 may be located between the signal line and the emission area EA. Herein, the signal line may be the first high-level supply voltage line VDDL1, and the emission area EA may be the area of the first electrode not covered by the bank BNK. Specifically, the repair area RPA of the first reference branch line RBL1 may refer to a part of the first reference branch line RBL1 in the C-shape that overlaps neither with the first high-level supply voltage line VDDL1 nor with the emission area EA. Referring to FIG. 7, the part of the first reference branch line RBL1 in the C-shape that does not overlap with the first high-level supply voltage line VDDL1 may include a part of the horizontal line on the upper side and a part of the horizontal line on the lower side in the C-shape when viewed from the top.

Accordingly, in the display device 100 according to the example embodiment of the present disclosure, the first repair bridge line RPBL1 is disposed, so that the repair process on the gate line GL can be stably carried out without compromising the aperture ratio. In addition, the display device 100 can increase the aperture ratio by disposing the first reference branch line RBL1 in the C-shape and by changing the location of the repair area RPA.

According to Comparative Example, when the plurality of sub-pixels includes red sub-pixels, white sub-pixels, green sub-pixels and blue sub-pixels, the red sub-pixels, the white sub-pixels, the blue sub-pixels and the green sub-pixels all have the emission areas and the non-emission areas arranged in one direction and thus they have a similar structure. That is to say, the sub-pixels according to Comparative Example do not have the inverted arrangement between the set of a red sub-pixel and a white sub-pixel and a set of a blue sub-pixel and a green sub-pixel in the display device 100 according to the example embodiment of the present disclosure. Therefore, according to Comparative Example, a high-level supply voltage branch line connected from a high-level supply voltage line could be extended across the red sub-pixel, the white sub-pixel, the blue sub-pixel and the green sub-pixel, and thus a line such as high-level supply voltage branch line could work as a bypass line for the gate line repair process.

Recently, in order to increase the design margin by adjusting the ratio between the emission area and the non-emission area in each pixel, the blue sub-pixel and the green sub-pixel are inverted with respect to the red sub-pixel and white sub-pixel in the y-axis direction. Specifically, in the red sub-pixel and the white sub-pixel, the emission area is disposed higher than the non-emission area in the y-axis direction, while in the blue sub-pixel and the green sub-pixel, the emission area is disposed lower than the non-emission area in the y-axis direction. Accordingly, a line horizontally extended in the non-emission area such as a high-level supply voltage branch line cannot pass through all of the plurality of sub-pixels.

Accordingly, in the display device 100 according to the example embodiment of the present disclosure, the first repair bridge line RPBL1 is connected to the high-level supply voltage lines VDDL in a pixel and traverses the emission area EA, so that a gate signal can be transmitted stably even during the repair process on the gate line GL. Specifically, if a defect occurs in a gate line GL, each of the high-level supply voltage lines VDDL close to the defective location is welded with the gate line GL, and the high-level supply voltage lines VDDL are welded at one end and the other end of the first repair bridge line RPBL1, respectively, so that the first repair bridge line RPBL1 can be electrically connected to the gate line GL.

In addition, as the first repair bridge line RPBL1 includes a stack structure in which an auxiliary metal layer or a transparent oxide layer is stacked on a semiconductor layer at some regions, the aperture ratio is not reduced even though it traverses the emission area EA. That is to say, when the first repair bridge line RPBL1 includes the stack structure of the semiconductor layer and the auxiliary metal layer at some regions, only the semiconductor layer is made conduct and is disposed on the emission area EA. When the first repair bridge line RPBL1 includes the stacked structure of the semiconductor layer and the transparent oxide layer at some regions, the entire first repair bridge line RBPL1 has transparency, so that light emitted from the emissive layer can be transmitted as it is even though it is disposed on the emission area.

Next, a repair area of a reference branch line according to Comparative Example will be described. According to Comparative Example, the reference branch line has a L-shape, i.e., it is extended in the x-axis direction from the reference line and is bent in the vertical direction to be extended in the y-axis direction in order to transmit a signal to each sub-pixel. The repair area was disposed at certain regions of the reference branch line which are extended in the y-axis direction. That is to say, the repair process was carried out at some regions of the reference branch line which are extended in a direction parallel to the signal lines such as the reference line and perpendicular to the gate line. As mentioned earlier, the repair area of the reference branch line is a full-tone area, whereas certain regions of the reference branch line disposed under the gate line is a half-tone area because it has to work as an active layer. The halftone area disposed on the lower side of the gate line has at least a certain length in order for the transistor to drive. Accordingly, the repair area should be disposed higher than the halftone area having such a length in the y-axis direction, and thus there is an inefficient space in the non-emission area which otherwise can be utilized as the emission area. In other words, the area of the non-emission area is increased and thus the aperture ratio is reduced.

Accordingly, in the display device 100 according to the example embodiment of the present disclosure, the first reference branch line RBL1 is disposed in C-shape instead of the L-shape so that it overlaps with the first high-level supply voltage line VDDL1, and the repair area RPA of the reference branch line RBL is disposed vertically. In this manner, the aperture ratio can be increased. That is to say, instead of the first reference branch line RBL1 extended in the x-axis direction and bent in the vertical direction to be extended in a straight line, by additionally forming the C-shaped line to overlap the first high-level supply voltage line VDDL1, the repair area RPA may be disposed between the first high-level supply voltage line VDDL1 and the emission area EA. Accordingly, in the display device 100 according to the example embodiment of the present disclosure, the repair area RPA which is the full-tone area is disposed on the side of the emission area EA, even the halftone area of the first reference branch line RBL1 lower than the existing repair area may be included in the emission area EA. That is to say, the inefficient space due to the existing repair area can be removed and the open area can be increased, so that the aperture ratio can be improved.

As a result, in the display device 100 according to the example embodiment of the present disclosure, the bypass line for the gate line GL can be formed to increase the open area through the first repair bridge line RPBL1, and the aperture ratio can be efficiently improved by changing the location of the repair area RPA of the first reference branch line RBL1. Additionally, in the display device 100 according to the example embodiment of the present disclosure, the open area can be increased, so that bending of the data lines DL can be reduced, thereby improving the aperture ratio.

Figure 8:
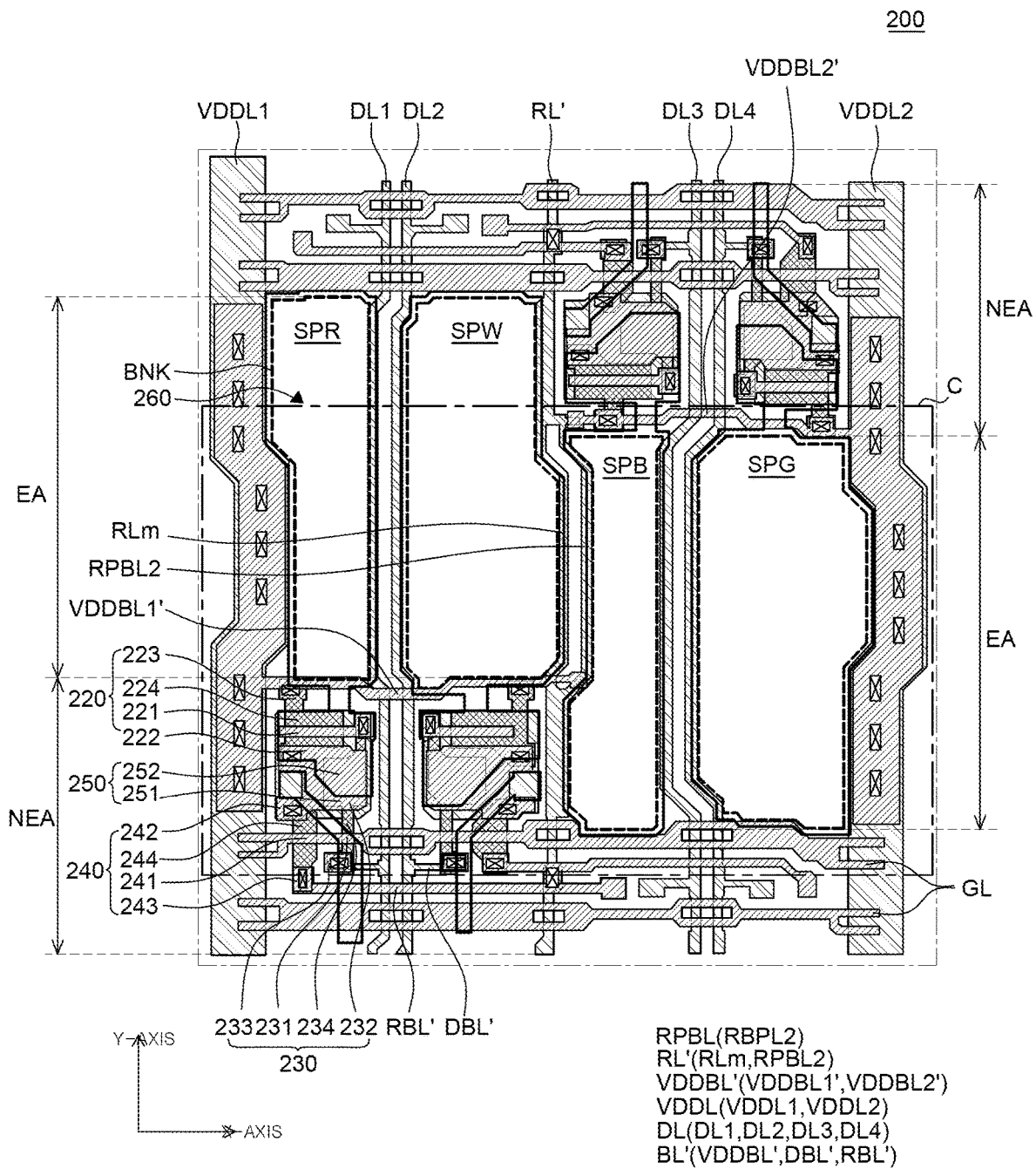
FIG. 8 is an enlarged plan view of a display device according to another example embodiment of the present disclosure.
Figure 9:
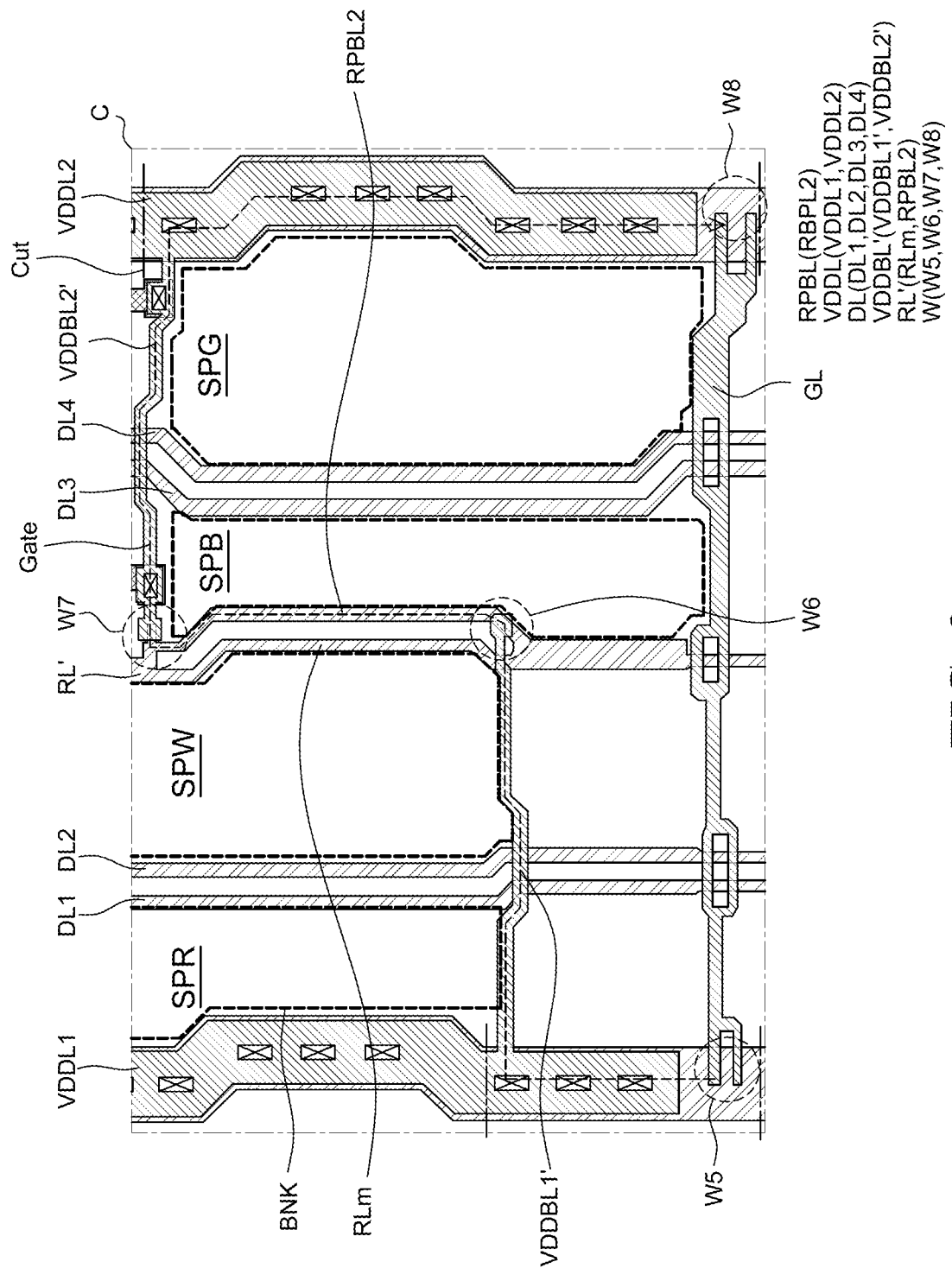
FIG. 9 is an enlarged view of area C of FIG. 8.

FIG. 8 is an enlarged plan view of a display device according to another example embodiment of the present disclosure. FIG. 9 is an enlarged view of area C of FIG. 8. FIG. 9 shows only high-level supply voltage lines VDDL, data lines DL, a reference line RL, a gate line GL among a variety of elements of a display device 200 for convenience of illustration. The display device 200 according to the example embodiment of FIGS. 8 and 9 is substantially identical to the display device 100 of FIGS. 1 to 7 except for a first transistor 220, a second transistor 230, a third transistor 240, a branch line BL' and a reference line RL; and, therefore, the redundant descriptions will be omitted.

Referring to FIG. 8, the first transistor 220 is disposed in the non-emission area NEA of each of the red sub-pixel SPR, the white sub-pixel SPW, the blue sub-pixel SPB, and the green sub-pixel SPG. The first transistor 220 includes a first gate electrode 221, a first source electrode 222, a first drain electrode 223 and a first active layer 224. The first transistor 220 electrically connected to the first electrode of the light-emitting element 260 and the high-level supply voltage line VDDL may be a driving transistor DT.

Initially, the first drain electrode 223 may be disposed on the buffer layer 111. The first drain electrode 223 is electrically connected to the plurality of high-level supply voltage lines VDDL. Specifically, the first drain electrode 123 may be electrically connected to the first high-level supply voltage line VDDL1 or the second high-level supply voltage line VDDL2 through a contact hole formed in the buffer layer, or the first drain electrode 123 may be formed integrally with a high-level supply voltage branch line VDDBL' Specifically, as shown in FIG. 8, the first drain electrode 123 of each of the red sub-pixel SPR and the white sub-pixel SPW may be formed integrally with a first high-level supply voltage branch line VDDBL1 extended from the first high-level supply voltage line VDDL1, and the first drain electrode 123 of each of the blue sub-pixel SPB and the green sub-pixel SPG may be formed integrally with a second high-level supply voltage branch line VDDBL2 extended from the second high-level supply voltage line VDDL2.

The first active layer 224 may be disposed on the buffer layer 111. The first active layer 224 may be made of, but is not limited to, a semiconductor material such as oxide semiconductor, amorphous silicon and polysilicon. For example, when the first active layer 224 is formed of an oxide semiconductor, the first active layer 224 may include a channel region, a source region and a drain region, and the source region and the drain region may be formed by making the material contained in the first active layer 224 conductive.

The first drain electrode 223 of the red sub-pixel SPR and the first drain electrode 223 of the white sub-pixel SPW may be formed integrally. The first drain electrode 223 of the blue sub-pixel SPB and the first drain electrode 123 of the green sub-pixel SPG may be formed integrally. Specifically, the first drain electrode 223 in the red sub-pixel SPR and the first drain electrode 223 in the white sub-pixel SPW may be formed integrally to share one first high-level supply voltage line VDDL1. For example, the supply voltage signal from the first high-level supply voltage line VDDL1 may be transmitted to the first drain electrode 223 of the white sub-pixel SPW through the first drain electrode 223 of the red sub-pixel SPR. The supply voltage signal from the second high-level supply voltage line VDDL2 may be transmitted to the first drain electrode 223 of the blue sub-pixel SPB through the first drain electrode 223 of the green sub-pixel SPG. It should be understood, however, that the present disclosure is not limited thereto. The first drain electrode 223 in the red sub-pixel SPR and the first drain electrode 223 in the white sub-pixel SPW may be formed separately, and the first drain electrode 223 in the blue sub-pixel SPB and the first drain electrode 223 in the green sub-pixel SPG may also be formed separately.

The first gate electrode 221 may be disposed on the gate insulator so that it overlaps with the first active layer 224 in each of the red sub-pixel SPR, the white sub-pixel SPW, the blue sub-pixel SPB and the green sub-pixel SPG. The first gate electrode 221 may be made of, but is not limited to, a conductive material, e.g., copper (Cu), aluminum (Al), molybdenum (Mo), nickel (Ni), titanium (Ti), chromium (Cr), or an alloy thereof.

The first source electrode 221 spaced apart from the first gate electrode 222 is disposed on the gate insulator 112 in each of the red sub-pixel SPR, the blue sub-pixel SPB and the green sub-pixel SPG. The first source electrode 222 may be electrically connected to the first active layer 224 through a contact hole formed in the gate insulator. The first source electrode 222 may be disposed on the same layer as the first gate electrode 221 and may be made of the same material, but the present disclosure is not limited thereto. The first source electrode 222 may be made of, but is not limited to, a conductive material, e.g., copper (Cu), aluminum (Al), molybdenum (Mo), nickel (Ni), titanium (Ti), chromium (Cr), or an alloy thereof.

The second transistor 230 is disposed in the non-emission area NEA of each of the plurality of sub-pixels SP. The second transistor 230 includes a second gate electrode 231, a second source electrode 232, a second drain electrode 233 and a second active layer 234. The second transistor 230 electrically connected to the gate line GL, the data line DL and the first gate electrode 220 of the first transistor 221 may be a switching transistor SWT.

Initially, the second drain electrode 233 may be disposed between the substrate 110 and the buffer layer 111 in each of the plurality of sub-pixels SP. The second drain electrode 233 is electrically connected to one of the plurality of data lines DL. The second drain electrode 233 may be formed integrally with the plurality of data lines DL and may be made of the same material as the plurality of data lines DL. It should be understood, however, that the present disclosure is not limited thereto. As shown in FIG. 8, the second drain electrode 233 may be formed of a plurality of data lines DL and data branch lines DBL connected through contact holes and may be disposed on the same layer as and made of the same material the first drain electrode 223. Specifically, the second drain electrode 233 may be made of, but is not limited to, a conductive material, e.g., copper (Cu), aluminum (Al), molybdenum (Mo), nickel (Ni), titanium (Ti), chromium (Cr), or an alloy thereof.

The second source electrode 233 spaced apart from the second drain electrode 232 is disposed in each of the plurality of sub-pixels SP. The second source electrode 232 may be the same node as the gate electrode 220 of the first transistor 221. The second source electrode 232 may be the same layer as the first gate electrode 221 or as the same layer as the second drain electrode 233. As shown in FIG. 8, when the second source electrode 232 is the same layer as the first gate electrode 221, the second source electrode 232 may be made of, but is not limited to, a conductive material, for example, copper (Cu), aluminum (Al), molybdenum (Mo), nickel (Ni), titanium (Ti), chromium (Cr) or an alloy thereof.

The second active layer 234 may be disposed on the buffer layer 111 in each of the plurality of sub-pixels SP. The second active layer 234 may be electrically connected to the second source electrode 232 and the second drain electrode 233. The second active layer 234 may be made of, but is not limited to, a semiconductor material such as oxide semiconductor, amorphous silicon and polysilicon.

The second gate electrode 231 may be disposed on the gate insulator 112 to overlap the second active layer 234 in each of the plurality of sub-pixels SP. The second gate electrode 231 may be made of, but is not limited to, a conductive material, e.g., copper (Cu), aluminum (Al), molybdenum (Mo), nickel (Ni), titanium (Ti), chromium (Cr), or an alloy thereof.

The second gate electrode 231 may be the gate line GL. That is to say, a part of the gate line GL may work as the second gate electrode 231. The gate line GL may be made of, but is not limited to, a conductive material, e.g., copper (Cu), aluminum (Al), molybdenum (Mo), nickel (Ni), titanium (Ti), chromium (Cr), or an alloy thereof.

The gate line GL transmits a gate signal to each of the plurality of sub-pixels SP, and is extended across the plurality of sub-pixels SP in the row direction. For example, the gate line GL may be extended in the row direction between the non-emission area NEA and the emission area EA of each of the plurality of sub-pixels SP, and may cross the high-level supply voltage lines VDDL, the data lines DL and the reference line RL extended in the column direction.

The third transistor 240 is disposed in the non-emission area NEA of each of the plurality of sub-pixels SP. The third transistor 240 includes a third gate electrode 241, a third source electrode 242, a third drain electrode 243 and a third active layer 244. The third transistor 240 electrically connected to the reference line RL, the gate line GL, and the second capacitor electrode 152 of the storage capacitor 150 may be a sensing transistor SET.

Initially, the third source electrode 242 may be disposed between the substrate 110 and the buffer layer 111 in each of the plurality of sub-pixels SP. The third source electrode 242 may be disposed on the same layer as the plurality of high-level supply voltage lines VDDL, the plurality of data lines DL, and the reference line RL, and may be made of the same material. The third source electrode 242 may be made of, but is not limited to, a conductive material, e.g., copper (Cu), aluminum (Al), molybdenum (Mo), nickel (Ni), titanium (Ti), chromium (Cr), or an alloy thereof.

The third source electrode 242 may work as a light-blocking layer that blocks light incident on the first active layer 224 of the first transistor 220. For example, if light is irradiated onto the first active layer 224, a leakage current may be generated, thereby reducing the reliability of the first transistor 220. The third source electrode 242 made of a non-transparent conductive material is disposed under the first active layer 224 and the first gate electrode 221, and can block the light incident on the first active layer 224 from below the substrate 110. In this manner, the reliability of the first transistor 220 can be improved.

The third active layer 244 may be disposed on the buffer layer 111 in each of the plurality of sub-pixels SP. The third active layer 244 may be electrically connected to the third source electrode 242 through a contact hole formed in the buffer layer 111. The third active layer 244 may be made of, but is not limited to, a semiconductor material such as oxide semiconductor, amorphous silicon and polysilicon.

The third gate electrode 241 may be disposed on the gate insulator 112 to overlap the third active layer 244 in each of the plurality of sub-pixels SP. The third gate electrode 241 may be the gate line GL. That is to say, a part of the gate line GL may work as the third gate electrode 241. The third gate electrode 241 may be made of, but is not limited to, a conductive material, e.g., copper (Cu), aluminum (Al), molybdenum (Mo), nickel (Ni), titanium (Ti), chromium (Cr), or an alloy thereof.

The third drain electrode 243 is disposed on the gate insulator 112 in each of the plurality of sub-pixels SP. The third drain electrode 243 may be electrically connected to the third active layer 244 through a contact hole formed in the gate insulator 112. The third drain electrode 243 may be formed integrally with the reference branch line RBL' connected to the reference line RL' through a contact hole and may be disposed on the same layer and made of the same material as the third gate electrode 241. That is to say, the third drain electrode 143 may be made of a conductive material, e.g., copper (Cu), aluminum (Al), molybdenum (Mo), nickel (Ni), titanium (Ti), chromium (Cr), or an alloy thereof.

Next, a second repair bridge line RPBL2 will be described with reference to FIGS. 8 and 9.

As described above, if a defect occurs in a gate line GL, e.g., the gate line GL is open, a repair process may be carried out on the gate line GL to cut the both sides of the location where the defect has occurred. After the repair process on the gate line GL is carried out and the gate line GL is disconnected, a gate signal is transmitted to the next pixel PX of the defective pixel PX through a bypass line.

In view of the above, the display device 200 according to the example embodiment includes a repair bridge line RPBL working as a bypass line for transmitting a gate signal in the repair process of the gate line GL. Since the repair bridge line RPBL has to work as a bypass line for transmitting a gate signal, it may be electrically connected to the gate line GL. It should be noted that the repair bridge line RPBL may be connected to the signal lines such as the high-level supply voltage lines VDDL and the reference lines RL, and may be formed on a different layer from the gate line GL.

In addition, the repair bridge line RPBL is not electrically connected to the gate line GL before the repair process, but may be electrically connected to the gate line GL after the repair process. That is to say, after the welding process included in the repair process has been carried out, the repair bridge line RPBL may be electrically connected to the gate line GL to transmit the signal.

In particular, the display device 200 according to the example embodiment includes a second repair bridge line RPBL2 that is an example of the repair bridge line RPBL.

The second repair bridge line RPBL2 may branch off from the reference line RL'. Specifically, the reference line RL' may include a main reference line RLm that can work as an existing reference line for transmitting a reference voltage, and the second repair bridge line RPBL2. The second repair bridge line RPBL2 needs to be electrically connected to the high-level supply voltage line VDDL because it has to work as a bypass line for the gate signal through the high-level supply voltage line VDDL. Accordingly, one end of the second repair bridge line RPBL2 may overlap with a first high-level supply voltage branch line VDDBL1' extended from the first high-level supply voltage line VDDL1, and the other end thereof may overlap with a second high-level supply voltage branch line VDDBL2; extended from the second high-level supply voltage line VDDL2. In addition, since the second repair bridge line PRBL2 branches off from the reference line RL' disposed in the non-emission area NEA, it does not overlap with the emission area EA.

Since the second repair bridge line RPBL2 branches off from the reference line RL', it may be formed of the same material on the same layer as the reference line RL'. That is to say, the second repair bridge line RPBL2 may be disposed on the same layer and may be made of the same material as the high-level supply voltage line VDDL and the plurality of data lines DL. Specifically, the second repair bridge line RPBL2 may be made of, but is not limited to, a conductive material, e.g., copper (Cu), aluminum (Al), molybdenum (Mo), nickel (Ni), titanium (Ti), chromium (Cr), or an alloy thereof.

In addition, referring to FIG. 9, the display device 200 according to the example embodiment of the present disclosure may include welding spots W for conducting a repair process. The welding spots W may include a fifth welding spot W5, a sixth welding spot W6, a seventh welding spot W7, and an eighth welding spot W8. At the fifth welding spot W5, the gate line GL and the first high-level supply voltage line VDDL1 may overlap each other. At the eighth welding spot W8, the gate line GL and the second high-level supply voltage line VDDL2 may overlap each other. At the sixth welding spot W6, the first high-level supply voltage branch line VDDBL1' and the second repair bridge line RPBL2 may overlap each other. At the seventh welding spot W7, the second high-level supply voltage branch line VDDL2' and the second repair bridge line RPBL2 may overlap each other.

The sixth welding spot W6 will be described as an example. After the repair process by laser is carried out, the first high-level supply voltage branch line VDDBL1' and the second repair bridge line RPBL2 are electrically connected with each other. That is to say, by irradiating the sixth welding spot W6 with laser, a buffer layer between the first high-level supply voltage branch line VDDBL1' and the second repair bridge line RPBL2 is partially removed so that the first high-level supply voltage branch line VDDL1' is in contact with the second repair bridge line RPBL2. The welding process conducted at the sixth welding spot W6 may be substantially equally applied to the fifth welding spot W5, the seventh welding spot W7 and the eighth welding spot W8.

That is to say, at the fifth welding spot W5 and the eighth welding spot W8, the first high-level supply voltage line VDDL1 and the second high-level supply voltage line VDDL2 may be electrically connected with the gate line GL, respectively, by the welding process. At the sixth welding spot W6 and the seventh welding spot W7, the first high-level supply voltage branch line VDDBL1' and the second high-level supply voltage branch line VDDBL2' may be electrically connected with the second repair bridge line RPBL2, respectively, by the welding process.

As a result, if a defect occurs in a gate line GL disposed in the plurality of sub-pixels SP, the high-level supply voltage lines VDDL and the gate line GL close to the defective location may be welded, and the high-level supply voltage branch lines VDDBL' extended from the high-level supply voltage lines VDDL and the second repair bridge line RPBL2 may be welded. Additionally, by cutting a part of the upper and lower portions of the high-level supply voltage line VDDL subjected to the welding process as indicated in FIG. 9, the second repair bridge line RPBL2 may become the bypass line for transmitting a gate signal. That is to say, referring to the line indicating transmission of a gate signal Gate in FIG. 9, even though the gate signal transmitted from the gate line GL is interrupted at the location where the defect occurs, the gate signal may be transmitted to the first high-level supply voltage branch line VDDBL1' through the fifth welding spot W5, the gate signal may be transmitted to the second repair bridge line RPBL2 through the sixth welding spot W6, the gate signal may be transmitted to the second high-level supply voltage branch line VDDBL2' through the seventh welding spot W7, and the gate signal may be transmitted to the gate line GL of the next pixel through the eighth welding spot W8.

Accordingly, in the display device 200 according to the example embodiment of the present disclosure, the second repair bridge line RPBL2 is disposed, so that the repair process on the gate line GL can be stably carried out without compromising the aperture ratio.

As described above, although there was a bypass line for a gate signal in a gate line repair process according to Comparative Example, such a bypass line cannot be used in recent inverted arrangement between a set of a blue sub-pixel and a green sub-pixel and a set of a red sub-pixel and a white sub-pixel. Specifically, in the red sub-pixel and the white sub-pixel, the emission area is disposed higher than the non-emission area in the y-axis direction, while in the blue sub-pixel and the green sub-pixel, the emission area is disposed lower than the non-emission area in the y-axis direction. Accordingly, a line that is horizontally extended in the non-emission area and works as a bypass line for a gate signal, such as a high-level supply voltage branch line, cannot pass through all of the plurality of sub-pixels.

In view of the above, in the display device 200 according to the example embodiment of the present disclosure, the second repair bridge line RPBL2 branches off from the reference line RL' and overlaps with the high-level supply voltage branch line VDDBL' in the pixel, so that a gate signal can be transmitted stably even during the repair process on the gate line GL. Specifically, if a defect occurs in a gate line, each of the high-level supply voltage lines VDDL close to the defective location is welded with the gate line GL, and the high-level supply voltage branch lines VDDBL' extended from the high-level supply voltage lines VDDL are welded at one end and the other end of the second repair bridge line RPBL2, respectively, so that the second repair bridge line RPBL2 can be electrically connected to the gate line GL.

In addition, the reference line RL' was disposed in the non-emission area NEA between the white sub-pixel SPW and the blue sub-pixel SPB, and the second repair bridge line RPBL2 branches off from the reference line RL', and thus the second repair bridge line RPBL2 does not reduce the aperture ratio. That is to say, even though the second repair bridge line RPBL2 is added, the area of the lines existing in the non-emission area NEA does not increase, and thus the open area is not reduced.

As a result, in the display device 200 according to the example embodiment of the present disclosure, it is possible to efficiently form a bypass line for a gate line GL to transmit a gate signal by virtue of the second repair bridge line RPBL2, without compromising the aperture ratio.

The example embodiments of the present disclosure can also be described as follows:

According to an aspect of the present disclosure, there is provided a display device. The display device includes a substrate having a plurality of sub-pixels provided thereon, each of the plurality of pixels including an emission area and a non-emission area. The display device further includes at least one gate line disposed in the non-emission area and extended in one direction. The display device further includes at least one signal line disposed in the non-emission area and crossing the at least one gate line. The display device further includes at least one repair bridge line connected to the at least one signal line. The plurality of sub-pixels includes a red sub-pixel, a white sub-pixel, a green sub-pixel, and a blue sub-pixel. A structure of the green sub-pixel and the blue sub-pixel is inverted with respect to a structure of the red sub-pixel and the white sub-pixel. The at least one repair bridge line is formed in a layer different from a layer of the at least one gate line.

The at least one repair bridge line may be electrically connected to the at least one gate line The at least one repair bridge line may be welded and is electrically connected to the at least one gate line The at least one repair bridge line may be disposed across the red sub-pixel, the white sub-pixel, the green sub-pixel and the blue sub-pixel.

The at least one signal line may include at least one high-level supply voltage line disposed in the non-emission area. The at least one repair bridge line may be electrically connected to the at least one high-level supply voltage line adjacent thereto.

The at least one signal line may include at least one high-level supply voltage line, at least one data line, and at least one reference line The at least one repair bridge line may be connected to the at least one high-level supply voltage line and traverses the emission area of each of the plurality of sub-pixels.

At least a region of the at least one branch line may include a stack structure of a semiconductor layer and an auxiliary metal layer.

Only the semiconductor layer of the stack structure of the at least one branch line may be make conductive and disposed where it overlaps with the emission area.

At least a region of the at least one branch line may include a stack structure of a semiconductor layer and a transparent oxide layer.

The display device may further include at least one reference branch line connected to the at least one reference line and applying a reference voltage to the plurality of sub-pixels. The at least one reference branch line may include a reference line repair area. The reference line repair area may be located between the at least one signal line and the emission area.

The at least one reference branch line may be disposed in a C-shape on an upper side of the at least one high-level supply voltage line.

The reference line repair area may be a part of the C-shape that overlaps neither with the at least one high-level supply voltage line nor with the emission area.

The reference line repair area may be a full-tone area.

The at least one repair bridge line may branch off from the at least one reference line.

The display device may further include a first high-level supply voltage branch line and a second high-level supply voltage branch line extended from the at least one high-level supply voltage line. Ends of the at least one repair bridge line may overlap with the first high-level supply voltage branch line and the second high-level supply voltage branch line, respectively.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
    a substrate having a plurality of sub-pixels provided thereon, each of the plurality of pixels including an emission area and a non-emission area;
    at least one gate line disposed in the non-emission area and extending in one direction;
    at least one signal line disposed in the non-emission area and crossing the at least one gate line;
    at least one repair bridge line connecting the at least one signal line to at least one of sub-pixels; and
    at least one welding spot, at each of which one signal line and one repair bridge line overlap each other, and
    wherein the at least one repair bridge line is formed in a layer different from a layer of the at least one gate line,
    wherein the at least one signal line includes at least one high-level supply voltage line, at least one data line, and at least one reference line,
    wherein the at least one repair bridge line connects the at least one high-level supply voltage line to the at least one sub-pixels.

2. The display device of claim 1, wherein the at least one repair bridge line electrically connects the at least one gate line to the at least one of sub-pixels.

3. The display device of claim 2, wherein the at least one repair bridge line is welded and is electrically connected to the at least one gate line.

4. The display device of claim 2, wherein the at least one repair bridge line is disposed across the red sub-pixel, the white sub-pixel, the green sub-pixel and the blue sub-pixel.

5. The display device of claim 4, wherein the at least one signal line includes at least one high-level supply voltage line disposed in the non-emission area, and
    wherein the at least one repair bridge line is electrically connected to the at least one high-level supply voltage line adjacent thereto.

6. The display device of claim 1, wherein at least a region of the at least one repair bridge line includes a stack structure of a semiconductor layer and an auxiliary metal layer.

7. The display device of claim 6, wherein only the semiconductor layer of the stack structure of the at least one repair bridge line is formed to be conductive at a region where it overlaps with the emission area.

8. The display device of claim 1, wherein at least a region of the at least one repair bridge line includes a stack structure of a semiconductor layer and a transparent oxide layer.

9. The display device of claim 1, further comprising:
    at least one reference branch line connected to the at least one reference line and configured to apply a reference voltage to the plurality of sub-pixels,
    wherein the at least one reference branch line includes a reference line repair area, and
    wherein the reference line repair area is located between the at least one signal line and the emission area.

10. The display device of claim 9, wherein the at least one reference branch line is disposed in a C-shape on an upper side of the at least one high-level supply voltage line.

11. The display device of claim 10, wherein the reference line repair area is a part of the C-shape that overlaps neither with the at least one high-level supply voltage line nor with the emission area.

12. The display device of claim 10, wherein the reference line repair area is a full-tone area.

13. The display device of claim 1, wherein the at least one repair bridge line branches off from the at least one reference line.

14. The display device of claim 13, further comprising:
    a first high-level supply voltage branch line and a second high-level supply voltage branch line extending from the at least one high-level supply voltage line,
    wherein ends of the at least one repair bridge line overlap with the first high-level supply voltage branch line and the second high-level supply voltage branch line, respectively.

15. The display device of claim 1, wherein the plurality of sub-pixels includes a red sub-pixel, a white sub-pixel, a green sub-pixel, and a blue sub-pixel.

16. The display device of claim 15, wherein a structure of the green sub-pixel and the blue sub-pixel is inverted with respect to a structure of the red sub-pixel and the white sub-pixel.

17. The display device of claim 1, wherein the one signal line and the one repair bridge line are electrically connected by irradiating the welding spot with a laser.

18. A display device comprising:
    a substrate having a plurality of sub-pixels provided thereon, each of the plurality of pixels including an emission area and a non-emission area;
    at least one gate line disposed in the non-emission area and extending in one direction;
    at least one signal line disposed in the non-emission area and crossing the at least one gate line;
    at least one repair bridge line connecting the at least one signal line to at least one of sub-pixels; and
    at least one welding spot, at each of which one signal line and one repair bridge line overlap each other, and
    wherein the at least one repair bridge line is formed in a layer different from a layer of the at least one gate line,
    wherein the at least one repair bridge line electrically connects the at least one gate line to the at least one of sub-pixels,
    wherein the at least one repair bridge line is disposed across the red sub-pixel, the white sub-pixel, the green sub-pixel and the blue sub-pixel.

* * * * *